(12) United States Patent
Slimak et al.

(10) Patent No.: US 6,303,234 B1
(45) Date of Patent: *Oct. 16, 2001

(54) PROCESS OF USING SODIUM SILICATE TO CREATE FIRE RETARDANT PRODUCTS

(76) Inventors: K. M. Slimak; Robert A. Slimak, both of P.O. Box 2444, Springfield, VA (US) 22152

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/818,195

(22) Filed: Mar. 14, 1997

Related U.S. Application Data

(60) Provisional application No. 60/013,452, filed on Mar. 15, 1996, and provisional application No. 60/040,709, filed on Mar. 14, 1997.

(51) Int. Cl.[7] ............... B05D 1/18; B05D 1/38; B32B 21/04
(52) U.S. Cl. .......... 428/537.1; 427/297; 427/397.8; 427/419.2; 427/419.7; 427/439; 427/440
(58) Field of Search .............. 427/297, 397.8, 427/419.2, 419.7, 439, 440; 428/537.1

(56) References Cited

U.S. PATENT DOCUMENTS

| | | | |
|---|---|---|---|
| 3,306,765 | * | 2/1967 | DuFresne et al. ............ 117/62 |
| 4,003,866 | * | 1/1977 | Paturle ............ 260/17.4 R |
| 4,062,991 | * | 12/1977 | Kyte et al. ............ 427/297 |
| 4,212,189 | * | 7/1980 | Fuchs et al. ............ 72/478 |
| 4,577,976 | * | 3/1986 | Hayashi et al. ............ 374/29 |
| 4,642,268 | * | 2/1987 | St.-Michel ............ 428/453 |
| 5,110,637 | * | 5/1992 | Ando et al. ............ 427/34 |
| 5,205,874 | * | 4/1993 | Crews, IV et al. ............ 148/254 |
| 5,431,996 | * | 7/1995 | Giesemann ............ 428/288 |
| 5,478,598 | * | 12/1995 | Shiozawa ............ 427/297 |
| 5,707,752 | * | 1/1998 | Misra et al. ............ 428/537.1 |

* cited by examiner

Primary Examiner—Shrive Beck
Assistant Examiner—Michael Barr
(74) Attorney, Agent, or Firm—Stevens, Davis, Miller & Mosher, LLP

(57) ABSTRACT

Cellulosic materials, including dimension lumber, plywood, particle board, wafer board, paper, fabric and similar materials, were treated with sodium silicate ($Na_2O.SiO_2$) in concentrations ranging from 400–0.04 g $Na_2O.SiO_2$/kg water and the surfaces of selected samples were further treated with silicon oxide (SiO or $SiO_2$) applied in a molecular to micron layer thickness by vapor deposition. Tests were conducted to determine the effectiveness of these materials in terms of fire resistance, durability, duration of effectiveness and moisture resistance. For sodium silicate as a sole treatment, flame retardance was found to increase as the concentration of sodium silicate in solution increased. To overcome the disadvantages of sodium silicate, sodium silicate treated samples were further treated by the deposition of a molecular coating of silicon oxide by vapor deposition. Samples treated by this technique were found to be completely moisture resistance. The combined application of sodium silicate and silicon oxide was found to provide a fire retardant product that is moisture resistant and decomposition resistant and, therefore, effective for internal and external uses. Sodium silicate treated materials, where the sodium silicate is coated with a thin layer of silicon oxide does appear to provide an effective fire retardant material.

21 Claims, 20 Drawing Sheets

PROCESS OF USING SODIUM SILICATE TO CREATE FIRE RETARDANT PRODUCTS

This application is a non-provisional application claiming the benefit of provisional application Ser. No. 60/013,452 (filed Mar. 15, 1996, in the names of Karen M. Slimak and Robert A. Slimak, entitled "Using Sodium Silicate to Create Fire Retardant Products") and provisional application Ser. No. 60/040,709 (filed Mar. 14, 1997 in the names of Karen M. Slimak and Robert A. Slimak, entitled "Effectiveness of Sodium Silicate and Micro-layers of Silicon Oxide Glassy Films in Imparting Fire Retardant Properties and Moisture Resistance to Cellulosic Materials") the entire disclosures of which are being incorporated by reference.

BACKGROUND OF THE INVENTION

1. Field of the Invention

The purpose of this invention is to provide 1) sodium silicate (water glass) impregnated wood materials introducing a fire retardant property to wood products, 2) water glass impregnation of other materials, such as paper and cloth, in such a way as to allow their intended functions while reducing the risk of flammability, and 3) wood products treated with sodium silicate can be used simultaneously to impart flame resistant properties to wood and to cause the wood to become termite resistant, providing an environmentally friendly method for long term termite control.

Liquid sodium silicate (water glass), applied to the surface of various products, can impart fire retardant properties. In the presence of fire, the sodium silicate will form foam-like crystals that help to provide an insulating barrier between the product and the flame, and will thus slow down the spread of fire. Wood and other products will become less flammable when treated with sodium silicate. The foam-like product appears to be more than a mere change in form of the sodium silicate. It is believed that the foam-like material is the product of a chemical reaction, and also imparts fire retardant properties to the material treated with sodium substrate.

It is a further purpose of the invention to provide a polymerized form of sodium silicate that is water insoluble: As a result of the application of heat, the sodium silicate undergoes dehydration (loss of water) and a process of polymerization that forms increasingly larger moieties of $(SiO_4)_n^{-1}$ while still maintaining an overall charge of −1 that forms an association with the free sodium. As the material polymerizes the resultant material increases in size to the point that it is no longer able to dissolve in water, thus becoming insoluble.

Cellulosic materials including dimension lumber, plywood, particle board, wafer board, paper, and fabric were treated with sodium silicate ($Na_2O.SiO_2$) in concentrations ranging from 400–0.04 g $Na_2O.SiO_2$/kg water and the surfaces of selected samples were further treated with silicon monoxide (SiO), applied in a molecular layer by vapor deposition. Tests were conducted to determine the effectiveness of these materials in terms of fire resistance, durability, duration of effectiveness, and moisture resistance.

Sodium silicate treated samples were further treated by the deposition of a molecular coating of silicon monoxide by vapor deposition. Samples treated by this technique were found to be completely moisture resistant. The combined application of sodium silicate and silicon monoxide was found to provide a fire retardant product that is moisture resistant and decomposition resistant, and therefore effective for internal and external uses. Sodium silicate coated with a thin layer of silicon monoxide does appear to provide an effective fire retardant material.

The purpose of this invention is also to provide 1) sodium silicate (water glass) impregnated wood materials will introduce a fire retardant property to wood, paper and cloth products, 2) the chemical and physical alternations of wood and other samples impregnated with sodium silicate, 3) the effects of moisture, air, temperature fluctuations, and weathering on sodium silicate treated samples, and 4) silicon oxide applied as a micro-layer to the surface of sodium silicate treated materials as an effective moisture barrier and guard against long term deterioration.

Liquid sodium silicate (water glass), applied to various products, can impart fire retardant properties. In the presence of fire, the sodium silicate will form foam-like crystals that help to provide an insulating barrier between the product and the flame, and will thus slow down the spread of fire.

In addition the sodium silicate penetrates the interiors of porous materials altering cellular structures and forming many microscopically thin glassy layers. A micro-layer of silicon oxide applied to the surface of a sodium silicate-treated material will make the material waterproof as well as prevent long term deterioration.

This invention provides impressive fire retardant properties for sodium silicate treated samples that would make this material all that would be desired in a fire retardant—highly effective, water insoluble, providing strengthening properties, and economical.

A further purpose of this study is to apply sodium silicate solutions to various samples for the purpose of evaluating the fire retardant properties of the resultant products. In the presence of fire, it is anticipated that the presence of non-combustible sodium silicate will render the cellulosic material less available to the flame and will retard vaporization of the cellulosic material; also sodium silicate is expected to form foam-like crystals that help to provide an insulating barrier between the product and the flame which will further separate the sample and the fire source, helping to reduce the temperature of the sample thus slowing down the spread of fire.

Sodium silicate is defined as water soluble (Condensed Chemical Dictionary, 1971). However, during pilot studies, it was noticed that as sodium silicate is exposed to large amounts of heat, parts of sodium silicate buildup would foam up, and this foam was water insoluble. This raised questions about the effect that excessive heating was having on sodium silicate. It was also noticed that when sodium silicate treated wood was subjected to heat from a flame torch, the flame was an orange/yellow color, as opposed to the light yellow traditional color of untreated wood burning. Two kinds of experiments were devised to examine the changes in sodium silicate that occur during exposure to intense flame and heat in the presence of wood. The first test was to examine water solubility versus temperature. The solubility of sodium silicate was measured after being exposed to different temperatures. The second test utilized an x-ray photoelectron spectrometer to examine the chemical composition of foamed sodium silicate byproducts.

Sodium silicate was expected to penetrate the interior of porous materials, altering cellular structures and forming many microscopically thin glassy layers. It is anticipated that the presence of sodium silicate was evident microscopically, and that the distribution patterns and interaction with cellular structures were discernible.

Products treated with sodium silicate were tested for durability, strength, and ability to withstand the effects of prolonged exposure to air, moisture, and weathering.

2. Description of the Related Art

Throughout history, house fires have been a major threat to the well-being of many families. According to the National fire Protection Association, in the United States in 1995 there were 600,000 structural fires in homes and businesses, causing approximately $7,620,000,000 in damages to property. The average loss per fire was $12,700. Over 30,000 people were injured in fires; there were 4585 deaths (12–13 per day) due to fire.

The possibility of awakening to the spectre of threatening flames strikes fear in the hearts of many, including this author, who was awakened to the acrid smell of smoke early on the morning of Jan. 26, 1995. An electrical fire in the garage had spread to nearby materials and had become a raging inferno before being discovered by a family member. The damage in this fire approached $150,000, but fortunately the effects on health were limited to a minor case of smoke inhalation. Unmeasured is the lingering fear, the memories of billowing smoke and fire, and the uneasy knowledge that it could and just might happen again, and that next time the damages might not be limited to property.

In spite of years of research, the United States remains the leader among developed nations in the number of fires occurring per year, the number of injuries and lives lost to fire, and total dollar value of property losses due to fire. The injuries and losses of life due to fire are highest among the elderly (more than double the average population), the infirm and among children. In spite of efforts to the contrary, the monetary damages, numbers of injuries and loss of life are likely to increase substantially in the future.

Fires occur in homes and business largely because of the flammability of the materials of construction and the large quantities of flammable materials placed in homes, offices and other buildings. Fires frequently start with a small flame or a spark that may last only a few seconds. The flames grow because this quick release of energy ignites nearby materials that are readily flammable especially when there is an ample supply of air. The flames then spread to other materials and grow in size and heat intensity. As the temperature increases the kindling temperature of other less flammable materials is reached and they can ignite suddenly causing the fire to spread quickly.

In recent years due to increasing costs for wood, there have been majors changes in the type of wood used in home construction. Historically, solid wood products were used as primary building materials in homes, for example 2x4's and 1x4's were used for framing, and rough wood planks were used for sub flooring and roofing support structures. The trend over the past several years has been to convert more and more from solid materials to composite materials. This is due to decreased costs for composite materials, and to the fact that many composite materials have advantages of lighter weight, less warping and increased strength. In the rush to convert to composite materials, properties related to flammability may not have received due consideration.

FIG. 1 compares weight loss profiles of 2x4 dimension lumber, 1x4 dimension lumber, 1x4 pressure treated pine, roofing shingles, plywood, pressed wood and wafer board samples. All samples were 30 cm in length, and were tested in a chamber in which two propane torches were applied to the bottom surface of each sample according to the procedures described elsewhere in this paper.

The data show that 2x4 samples exhibited the slowest rates of burn and the lowest weight loss of all samples tested. Although 2x4 lumber [10] definitely will burn, the combined effects of two torches applied indefinitely was insufficient to cause a 30 cm sample to ignite and burn spontaneously. All other samples [11–16] ignited and burned readily; however, 1x4 pressure treated pine [11] and 1x4 untreated dimension lumber [12] generally showed slower times for ignition and lower combustion rates than the remaining samples [13–16] as follows: [13] particle board, [14] plywood, [15] shingle, and [16] wafer board.

Data listing ignition times and combustion rates is presented in Table 1 and in FIG. 2. The data for wafer board, shingles and plywood was particularly important because the steep slope of the weight loss profiles for these samples indicated that between 20 and 70 percent of these samples were burned per minute. Plywood (70%/min) is the material of choice in most homes for sub flooring, sub roofing and occasionally in walls of homes. Wafer board is becoming increasingly popular as a structural material, replacing 2x4's and 4x4's. Each of these three materials was completely consumed in 2–6 minutes in the standard fire tests conducted. In FIG. 2 represents the results of combustion duration (min) for 2x4 lumber; the test was stopped at 60 minutes. In this sample only, combustion was incomplete. In FIG. 2 indicates that spontaneous burning did not occur in the 2x4 lumber sample.

TABLE 1

Burn Characteristics of Common Building Materials

| Building Material | Ignition Time (min) | Combustion rate (% sample/min) | % of Sample Consumed | Combustion Completed (min) |
|---|---|---|---|---|
| 2x4 dimension lumber | >60 | 1.6 | 33 | 20 (test ended) |
| 1x4 pressure treated pine | 5 | 6.7 | 89 | 18 |
| 1x4 dimension lumber | 1 | 6.5 | 87 | 15.5 |
| particle board | 1.2 | 7.1 | 79 | 10.5 |
| wafer board | 3 | 23.3 | 88 | 6 |
| shingle | 0.17 | 21.1 | 80 | 4 |
| plywood | 0.2 | 70.7 | 85 | 2.5 |

Currently, new homes are frequently constructed with sub floors, sub roofs, and all structural components incorporating plywood and wafer board, highly flammable materials that burn at a rate 13 to 45 times greater than that of 2x4 dimension lumber.

There is therefore a need to identify building materials that provide the desired construction-properties and yet decrease the flammability of the materials to below that of 2x4 dimension lumber. There is also a need to increase the fire retardant properties of furniture, fabrics, paper and other combustible materials that are stored inside structures.

Materials to be made resistant to fire in the present study—wood, wood composites, paper and fabric—are primarily natural polymers. As has been demonstrated above, these substances vary in flammability due to the nature of the polymers, and the density and particle size of the substance, eg 2x4 very dense with large particle sizes, and loosely woven fabric—low density with small particle sizes.

The major problems preventing widespread use of fire retardants are the costs of use, effects on physical properties of the treated materials, the water solubility of most fire retardant chemicals, making the treated samples vulnerable to leaching, and the lack of regulations requiring the use of these materials.

Based on the fact that the burn characteristics described above (FIG. 1) were obtained from samples purchased randomly in retail outlets, this investigator concluded that the fire retardants described in the literature have not yet developed attributes that are sufficiently attractive to be implemented in large scale in commercial applications in wood products. Therefore this investigator decided to search for another substance to use in fire retardant applications.

This investigator observed that sodium silicate exhibited strong adhesive properties in addition to being a noncombustible material, and theorized that the adhesive properties might be used to provide fire retardant properties in certain products. This investigator was intrigued by the fact that the possible incorporation of glass-like materials into wood and other products potentially would possibly strengthen the products as well as impart fire retardant properties.

This investigator coated small samples of wood and noticed that when the sodium silicate treated samples were applied to a flame, sodium silicate residues formed bubbles that provided a physical barrier against the flame in addition to reducing available access to flammable materials by oxygen, as heating continued the sample became incandescent. It appeared that as sodium silicate formed bubbles and droplets, the wood remained unaffected by the flame.

The idea for this invention came to me easily. My sister was using water glass to glue glass planes together to make test chambers for her science fair project. I wondered if it was possible to coat wood with water glass and help make the wood fire retardant. As I watched her work with the water glass, I played around with it and coated small pieces of wood and noticed that when the pieces were applied to a very hot flame, the water glass bubbled over forming a natural barrier against the flame. Thus, it appeared to me that as the sodium silicate formed bubbles, the wood remained unaffected by the flame.

A fire retardant material is one having properties that provide comparatively low flammability or flame spread properties (ASTM 1992). There are a number of materials that have been used to treat wood for fire retardancy including ammonium phosphate, ammonium sulfate, zinc chloride, dicyandiamide-phosphoric acid and sodium borate. Solutions of these fire-retardant formulations are effective when injected into the wood under pressure (Condensed Chemical Dictionary 1971). If my hypothesis is correct, that water glass is an effective fire retardant when applied as a coating, then it could be an important finding since it is virtually non-toxic, safe to use, relatively cheap, readily available and can be easily used by the homeowner.

Sodium silicate (water glass) is a member of the family of soluble sodium silicates and is considered the simplest form of glass. The formula varies from $Na_2O_3 \cdot SiO_2$ to $2Na_2OSiO_2$ depending on the proportions of water. The composition used in this study was a 40 percent concentration. Water glass is derived by fusing sand and soda ash; it is noncombustible with low toxicity. It is used as catalysts and silica gels; soaps and detergents; adhesives; water treatment; bleaching and sizing of textiles and paper pulp; ore treatment; soil solidification; glass foam; pigments; drilling muds; binder for foundry cores and molds; waterproofing mortars and cements; and impregnating wood. The latter use, however, has not been linked with fire retardancy (Condensed Chemical Dictionary 1971).

The terms used with flame-resistant materials are sometimes confusing. Fire resistance and flame resistance are often used in the same context as the terms fireproof or flameproof. A material that is flame resistant or fire resistant does not continue to burn or glow once the source of fire has been removed, although there is some change in the physical and chemical characteristics of the material. Fireproof or flameproof refer to material that is totally resistant to fire or flame, such as asbestos. Most organic material like wood undergo a glowing action after the flame has been eliminated. This "afterglow" may cause as much damage as the flaming itself.

The mechanisms of fire-retardancy are complicated. The coating theory reveals that fire resistance is due to the formation of a layer of fusible material which melts and forms a coating, thereby excluding the air necessary for the flame to propagate. This theory, first reported by Gay-Lussac in 1821, was the basis for the development of fusible salts such as carbonates, borates, and ammonium salts. The gas theory theorizes that the flame retardant produces noncombustible gases which dilutes the flammable gases. The thermal theory suggests that the flame is dissipated by an endothermic change in the retardant and the heat supplied from the source is conducted away from the wood so fast that combustion temperatures are never reached. Chemical theory says that the strong acids and bases (water glass is a strong base) impart some degree of fire retardancy (Concise Encyclopedia of Chemical Technology 1985).

My theory, and the basis for my hypothesis, is that sodium silicate can make wood and other products fire retardant. The sodium silicate will enter the voids in the wood, and harden into glass. The sodium silicate will separate the wood fibers from one another, and not allow burning. Any flame applied to the samples will not burn or spread, because it comes in direct contact with the sodium silicate. The preliminary observations I made on my own with sodium silicate and small pieces of wood showed that when in contact with a very hot flame, the sodium silicate bubbles over, forming a natural barrier against the flame and the wood remains unaffected by the flame.

To test my theory, I decided to treat (by dipping and soaking) dimension lumber with different concentrations of water glass and to burn the treated products with a propane torch to determine the potential for fire retardancy.

SUMMARY OF THE INVENTION

Dimension lumber (1"×4"×12" pine and 2"×4"×12" spruce), 1"×4"×12" pressure treated pine samples and composite materials were treated with sodium silicate by dipping (a 24-hour exposure) and soaking (a 7-day exposure) in water glass. Paper and cloth samples were similarly treated. The samples were then air dried at room temperature for a minimum of seven days. To test for fire retardancy, the wood samples were subjected to a hot flame from two propane torches for 20 minutes, and the paper and cloth samples were subjected to a candle flame. Data on flame propagation, afterglow, ash development and weight loss were collected during and after the burns. To measure variability, four replicates of each sample were burned along with an untreated sample (a control), and a sample treated with sodium borate, a known fire retardant chemical.

Samples were examined microscopically to determine characteristics of the distribution of sodium silicate within the samples. Sodium silicate-treated samples of 1×4 pine, shingles, wafer board and large popsicle sticks were treated with ultra-thin layers of silicon oxide. Sodium silicate treated samples were also oven cured and were subjected to flame to convert them to glass thus imparting strength, further fire retardant properties and added strength. The samples were tested for fire retardant properties by the usual methods, for moisture resistance by exposure to boiling water and examining microscopically for evidence of sodium silicate crystals, and for strength by compression tests.

A possible solution to both the problem of moisture-related leaching and deterioration during air exposure was identified.

It was hypothesized that after being treated with sodium silicate, if a layer of silicon oxide were deposited over all surfaces, the resulting product will retain its flame retardant properties as well as be completely water proof and completely resistant to deterioration due to exposure to air or the effects of weathering. Because extraordinarily small amounts of silicon oxide would be used, the added costs would be expected to be small.

The present invention thus involves a process of imparting fire retardant properties to a cellulosic material comprising coating a cellulosic material with sodium silicate by contacting a sodium silicate solution with the material to be coated, dehydrating the coating, and depositing a coating of a silicon oxide glassy film on the sodium silicate coated material. In one embodiment, the coating of silicon oxide is a monomolecular layer of silicon monoxide.

DETAILED DESCRIPTION OF THE PREFERRED EMBODIMENT

Figure 1:
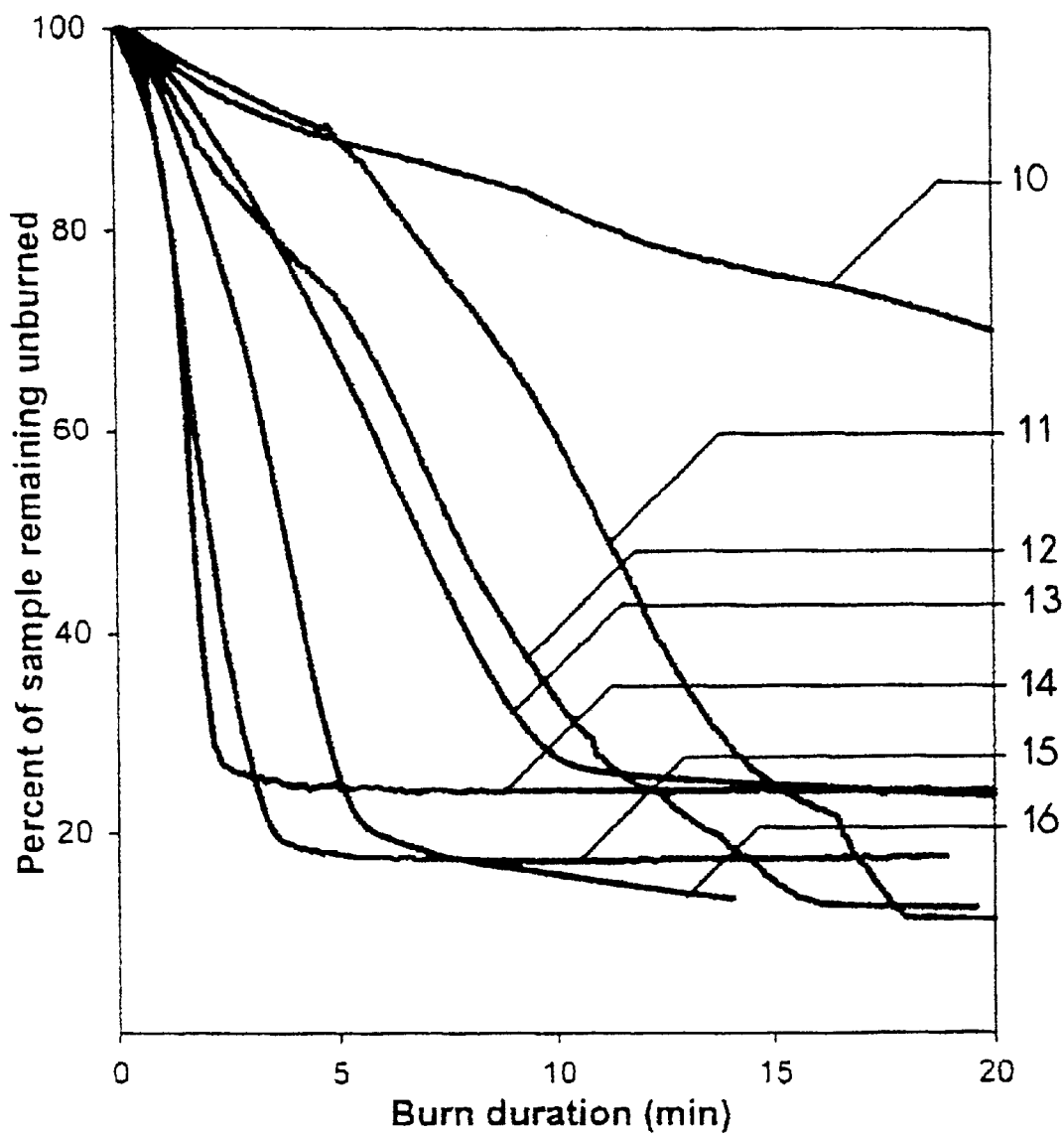
FIG. 1 shows the weight loss profiles for each of the following building materials: a) 2×4 lumber, b) 1×4 pressure treated pine, c) 1×4 lumber, d) particle board, e) wafer board, f) shingle, and g) plywood.
Figure 2:
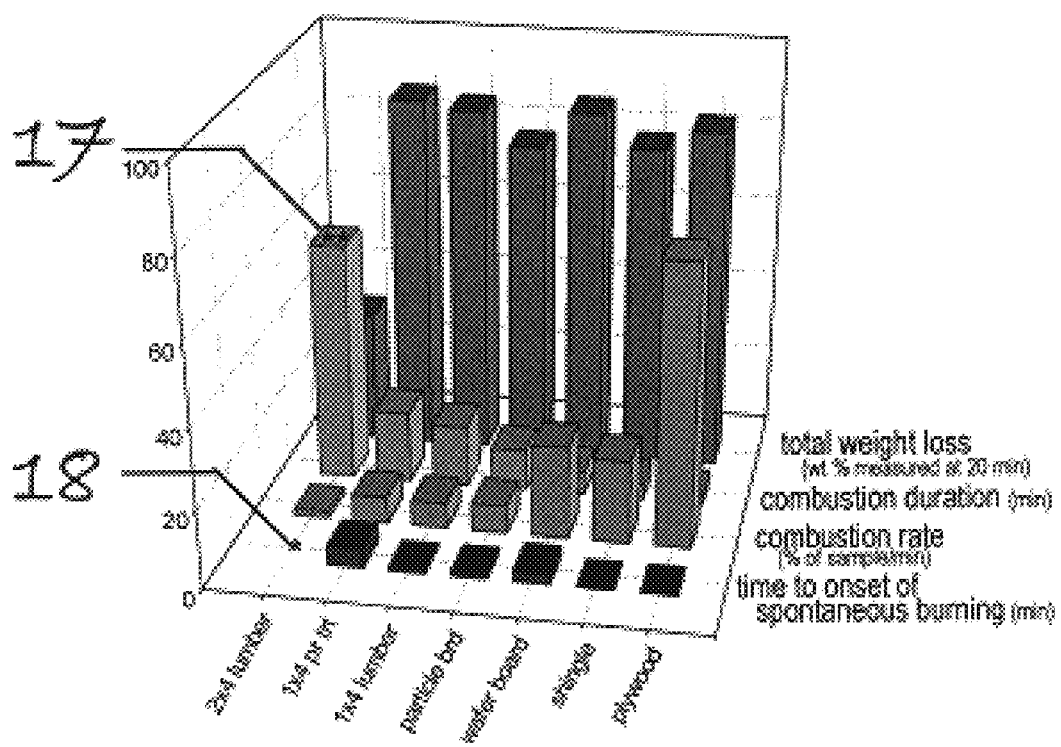
FIG. 2 compares combustion parameters.

Wood products, specifically wood commonly used in construction including 1"×4"×12" pine, 2"×4"×12" spruce, 1"×4"×12" pressure treated pine, composite wood materials such as plywood, particle board, and wafer board, and samples of paper and fabric were treated with different concentrations of sodium silicate ($Na_2O.SiO_2$) also known as water glass to test the hypothesis that water glass would make these products fire retardant. Using a propane torch as a fire source, the results show that fire retardancy was greatest at the highest concentrations of water glass and all water glass treated samples were more fire retardant than the untreated controls. In general, the more easily combustible the substance studied, the greater was the fire retardant effect of sodium silicate. Upon application of the torch, the sodium silicate bubbled up and became crusty; thus providing a physical barrier against flame spread. The treated samples would only burn in the most intense part of the flame, with virtually no flame propagation. All of the untreated composite samples and pressure treated samples burned particularly vigorously, and thoroughly. The most easily burned wood-based untreated control was wafer board which proved to be highly combustible. Of all wood-based samples wafer board flame resistance was the most improved after treatment with water glass. The greatest difference between the treated samples and the control was found with samples that were highly flammable for example paper and cloth. In addition, since most fires start with flammable materials inside a building such as with paper and drapery, the findings that flammability can be reduced by up to 90% with the use of water glass, suggests that this substance may have potential for fire prevention in paper and cloth products. Water glass is readily available, is relatively cheap and virtually non-toxic It can be applied to wood at industrial wood-preserving operations and can be easily applied by the homeowner. Sodium silicate, water glass, does appear to be an effective fire retardant chemical.

Treating the Samples with Water Glass

Dimension Lumber:

Pieces of kiln-dried 1"×4" pine dimension lumber, 2"×4" spruce dimension lumber, and pieces of 1"×4" pressure treated lumber were placed in plastic tanks (dimensions 2 ft×1 ft×8 in) filled with water glass solutions to a depth of 6". The pieces were placed in the tank in such a way that they were completely submerged and yet not in direct contact with each other. For the "Soak-Treated" lumber, the pieces remained in the treatment tanks for seven days after which time the pieces were removed from the tank and placed for seven days on a drying apparatus designed to keep the wood pieces from touching all but very small occasional supporting points. The borax treated sample was prepared similarly using a saturated aqueous solution consisting of seven (7)

parts of sodium borate (Borax®) and three (3) parts boric acid, by weight. The controls were not treated. The wood was weighed before and after treatment with the fire retardants. The same procedures were used for the "Dip-Treated" wood except the wood was submerged in the solutions of fire retardants for only 24 hours.

Composite Materials:

Pieces of wafer board, plywood and particle board were made and then treated with water glass. For the wafer board and the particle board, sawdust or wood shavings were mixed with 100% water glass until the mixture was damp, thoroughly wet, and compressible. Then portions of the mixture were compressed in a form under pressure for approximately 24 hours. The water glass-wood composite materials were removed from the forms and allowed to dry for seven days. The plywood was made from balsa wood which was soaked for seven days in 100% water glass. Then the pieces were assembled in 5 layers with alternating grain patterns to form a final plywood sample 3"×9"×½". The plywood was dried under pressure using clamps for seven days to achieve the desired shape and density. The borax treated samples were prepared similarly using a saturated aqueous solution consisting of seven (7) parts of sodium borate (Borax®) and three (3) parts boric acid, by weight. The remaining controls were not treated. The wood was weighed before and after treatment with the fire retardants.

Eight samples each of wafer board, plywood and particle board were made and treated with water glass. Sodium silicate was used as the fire retardant and as the adhesive material forming the composite. For wafer board and particle board samples, sawdust or wood shavings were mixed with 400 g/kg water glass until the mixture was damp, thoroughly wet, and compressible. Then portions of the mixture were compressed in a Teflon-lined form for approximately 24 hours. The water glass-wood composite materials were removed from the forms and allowed to dry for seven days. Plywood was made from balsa wood which was soaked for seven days in 400 g/kg water glass. The pieces were then assembled in 5 layers with alternating grain patterns to form plywood samples with dimensions 3"×9"×½". The plywood was dried under pressure using clamps for seven days to achieve the desired shape and density. Borax treated samples were prepared by soaking commercially manufactured pieces of plywood for seven days, in the manner described above for 1×4 lumber, using a saturated aqueous solution consisting of seven (7) parts of sodium borate (Borax®) and three (3) parts boric acid, by weight. Untreated samples of wafer board, plywood and particle board were used as controls.

The above described procedures for preparation of composite materials with 400 g/kg sodium silicate were repeated using a 40 g/kg solution of sodium silicate, and then repeated again using a 4 g/kg solution of sodium silicate.

Cloth samples: Eight pieces of water glass-impregnated cloth test pieces were each made by combining 50 g water glass and water, 200 g water and laundry lint. The mixture was spread thinly on a screen and dried for seven days. The product was a felt-like material 4 in×12 in. For the control cloth test pieces were made as described above without the inclusion of water glass. Two additional test samples were prepared by combining laundry lint and water and adding a saturated aqueous solution consisting of seven (7) parts sodium borate (Borax®) and three (3) parts boric acid, by weight, in amounts suitable to form a finished cloth product, and then drying. Another untreated control was also used.

In addition, to better understand and examine the use of sodium silicate for cloth and fiber applications, eight pieces of cotton knit fabric, 6 in×2 in, were immersed in each of the following concentrations of sodium silicate: 40 g/kg, 4 g/kg and 0.4 g/kg. The procedure for sodium silicate treatment of all knit fabric samples were identical, except for the variation in sodium silicate concentration, and was as follows: Eight swatches of fabric, 6 in×2 in, were placed in a large beaker and submerged in a 1 liter solution containing one of the above listed concentrations of sodium silicate. The container was tightly covered and the solution was gently stirred for 48 hours by means of a Teflon stirring bar magnet. The samples were then removed and dried on a metal mesh screen for eight hours followed by final drying on Teflon sheets for one day. Control samples were prepared by similarly immersing 8 each, cotton knit samples into distilled water for 48 hours and then drying as for the treated samples. Control samples, 8 each, of a saturated aqueous solution of sodium borate and boric acid were also prepared in the manner described above for sodium silicate treated samples. Fiber samples were microscopically examined to ascertain the distribution of sodium silicate among the cotton fibers, and were tested for flammability as described below.

In addition, samples of treated surgical cotton were prepared in order to study the nature of sodium silicate penetration into natural fibers and to determine the potential for use of sodium silicate as an upholstery stuffing. Eight samples each of 400 g/kg, 40 g/kg, 4 g/kg, 0.4 g/kg, and 0.0 4 g/kg sodium silicate treated gauze were prepared as follows: 8 each, 25 g samples of surgical cotton were immersed in a beaker containing a 1 liter solution of sodium silicate, for example a 40 g/kg solution. The container was tightly covered and the solution were gently stirred for 48 hours by means of a Teflon stirring bar magnet. The samples were then removed and dried on a mesh screen for eight hours followed by final drying on Teflon sheets for one day. Control samples were prepared by similarly immersing 8 each, 25 g pieces of cotton batting into distilled water for 48 hours and then drying as for the treated samples. Control samples, 8 each, of a saturated aqueous solution of sodium borate and boric acid were also prepared in the manner described above for sodium silicate treated samples.

Paper samples:

Eight pieces of water glass-impregnated paper test pieces were each made by combining 50 g water glass and water and 200 g water and 6 sheets of pulverized paper. The mixture was spread thinly on a screen and dried for seven days. The product was a coarse paper material 4 in×12 in. The untreated control was made without water glass. Two additional test samples were also prepared by combining pulverized paper and water and adding a saturated aqueous solution consisting of seven (7) parts sodium borate (Borax®) and three (3) parts boric acid, by weight, in amounts suitable to form a finished paper product containing borax, and then drying.

Sodium silicate impregnation of paper was also accomplished by immersing 6 in×2 in sheets of paper in sodium silicate solutions. Eight pieces of paper, 6 in×2 in, were immersed in each of the following concentrations of sodium silicate: 40 g/kg, 4 g/kg, 0.4 g/kg and 0.04 g/kg. The procedure for sodium silicate treatment of all paper samples was identical, except for the variation in sodium silicate concentration, and was as follows: Eight swatches of paper, 6 in×2 in, were placed in a large beaker and submerged in a 1 liter solution containing one of the above listed concentrations of sodium silicate. The container was tightly covered and the solution was very slowly and gently stirred for 48 hours by means of a Teflon stirring bar magnet. The samples were then removed and dried on a mesh screen for eight hours followed by final drying by ironing on a Teflon ironing board cover. Control samples were prepared by similarly immersing 8 each, paper samples into distilled water for 48 hours and then drying as for the treated samples. Control samples, 8 each, of a saturated aqueous solution of sodium borate and boric acid will also be prepared in the manner described above for sodium silicate treated samples. Fiber samples were microscopically examined to ascertain the distribution of sodium silicate among the cotton fibers, and were tested for flammability as is described below.

High pressure apparatus:

Samples (6 in×4 in×1 in pine) were placed in a high pressure chamber of original design. The chamber was filled with 400 g/kg sodium silicate and hand pumped to a pressure of 1000 psi. Each sample was maintained at this pressure for 30 minutes. After which time the pressure was released and the sample was allowed to dry. Each sample was then subjected to the propane flame tests described below.

Termite Reaction to Water Glass Treated Samples

Thirty small pieces of wood, 0.5 in on a side, were treated with water glass as described above for 100% water glass with a seven day soaking period and subsequent seven day drying period. Other pieces of wood, of identical size, that are not water glass treated were used as controls. Thirty pieces of water glass treated wood cubes were placed in each of a 1-quart glass test chamber. A second test chamber contained only untreated wood cubes. Worker termites and moist paper towels were added to each container to form a suitable terrarium environment. Termite activity was be observed for 2 months.

Burn Testing

High-Temperature Propane Burn Tests:

Both the treated and untreated wood was subjected to a 2500° F. flame supplied by a "Bernz-O-Matic" 400 gm propane fuel cylinder with a JT-680 tip (Model TX-9). The wood was suspended vertically, side-by-side, approximately 10 inches apart from a metal rack made from copper tubing and designed to burn six (6) pieces of wood simultaneously. Each "burn" event consisted of burning six pieces of wood: four (4) treated pieces; one (1) piece treated with sodium borate, and one (1) piece of untreated wood. The untreated and sodium borate treated pieces served as controls. During each burn event, flames from two propane torches, one in front and one in back of each piece of wood and each slightly offset in opposite direction from the center, were directed at the down-side edge of the suspended wood The burn event was divided into three periods: burn initiation ($T_0$), burn period ($T_{1-20}$), which lasted 20 minutes, and post burn period ($T_{20-35}$) when observations were continued 15 minutes after the torches were turned off. Observations such as amount of flame produced, flame spread or propagation, area of burn, amount of after glowing, percent of wood burned and weight after burning were recorded on data sheets. Each burn event was also recorded on a video camera.

The method described here for testing the combustible properties of treated wood is a departure from the standard test method recommended by the American Standards and Testing Methods (ASTM). Standard method E 69-95 (ASTM 1995) describes a method where the combustible material is placed in an apparatus known as a "fire-tube assembly" and measurements similar to that described above are made. The fire-tube apparatus can only accommodate a small piece of wood, ¾ in×⅜ in×40 in in length, which is much smaller than the pieces in this study, and can only burn one piece of wood at a time. I wanted to experiment on pieces of wood that were about the same size as wood commonly used by homeowners and I wanted a side-by-side comparison between treated and non-treated wood. The fire-tube apparatus is also not readily available. The measurements called for by this standard method, however, are essentially the same as those taken during this study.

Candle Tests:

The cloth and paper samples and the sodium borate/boric acid treated and untreated controls were each placed in a flame test chamber and tested as described above for the propane flame test with the exception that the flame was from a 5 in candle. The flame was directed at the bottom of the test samples throughout the test period.

In addition water glass treated samples of 2×4 dimension lumber were subjected to candle flame for 1.5 hours. The nature of burn patterns were in comparison to those of untreated controls.

Thermochemistry of Sodium Silicate Fire Retardant

In order to better characterize the changes occurring during flame tests with sodium silicate impregnated samples, the foam-like residues formed during the flame tests were subjected to x-ray crystallography and by x-ray photo electron spectrometry. The purpose of the analysis was to chemically identify the composition of the residue from flame tests. This data was then augmented by performing studies of water solubility.

Micro-Layers of Vacuum-Deposited Silicon Oxide Glassy Films

Sodium silicate, while proving to be an effective fire retardant, has a number of significant problems which limit its use to indoor application only, and prevent its use as a surface coating. The problems inherent to sodium silicate-treated samples were: 1) it was water soluble and thus rain or other moisture could cause the sodium silicate to leach from treated products, 2) when sodium silicate was applied directly onto a surface by methods such as painting, coating, and quickly dipping, extensive peeling, cracking and separation from the surface of the product occurred.

In the course of about six months it was observed that sodium silicate, when exposed to the air and and/or weathered, underwent a physical change from a clear, smooth, shiny, material to white, granular, flaky, rough chips. It was also observed that sodium silicate, when protected completely from the air by any of several means, did not undergo the physical change and remained a clear, smooth, shiny, material.

From these observations, it was concluded that the physical change observed for sodium silicate was directly due to exposure to moisture, oxygen and other substances found in the air.

It was hypothesized that after being treated with sodium silicate, if a layer of silicon oxide were deposited over all surfaces, the resulting product will retain its flame retardant properties as well as be completely water proof and completely resistant to deterioration due to exposure to air or the effects of weathering. Because extraordinarily small amounts of silicon oxide would be used, the added costs would be expected to be small.

The present invention thus involves a process of imparting fire retardant properties to a cellulosic material comprising coating a cellulosic material with sodium silicate by contacting a sodium silicate solution with the material to be coated, dehydrating the coating, and depositing a coating of a silicon oxide glassy film on the sodium silicate coated material. In one embodiment, the coating of silicon oxide is a monomolecular layer of silicon monoxide.

The following samples were prepared:

Blocks of wood, 2.5 cm$^3$, presoaked in 40 g/kg sodium silicate,

Sections of wood, 2.5 cm×10 cm×0.5 cm, 4 each treated with the following concentrations: 400 g/kg, 40 g/kg, 4 g/kg, 0.4 g/kg, and 0.04 g/kg of aqueous sodium silicate, and 4 each controls of the same concentrations (but not treated with silicon monoxide).

Four of each of the above sample types were held in place with clamps at a 90° angle. Two drops of boiling distilled water was then placed onto each sample and allowed to roll across the sample and fall onto a microscope slide and allowed to evaporate. The samples were then examined visually and microscopically for evidence of crystal formation.

Four each of the above sample types were subjected to burn tests, to compare efficiency of burning with and without the silicon monoxide coating.

Microscopic examination of sodium silicate and silicon oxide treated products:

To better understand the distribution of sodium silicate throughout the samples, microscope slides were prepared for selected samples. These slides were examined under the microscope and compared to slides prepared from controls for evidence of sodium silicate distribution and impregnation of the samples. From these data, information was obtained on whether soaking procedures resulted in an even distribution of sodium silicate throughout the entire sample or whether sodium silicate was distributed primarily along the outer edges of the samples.

EXAMPLE 1

1×4 Pine—Propane Flame Tests

Figure 3:
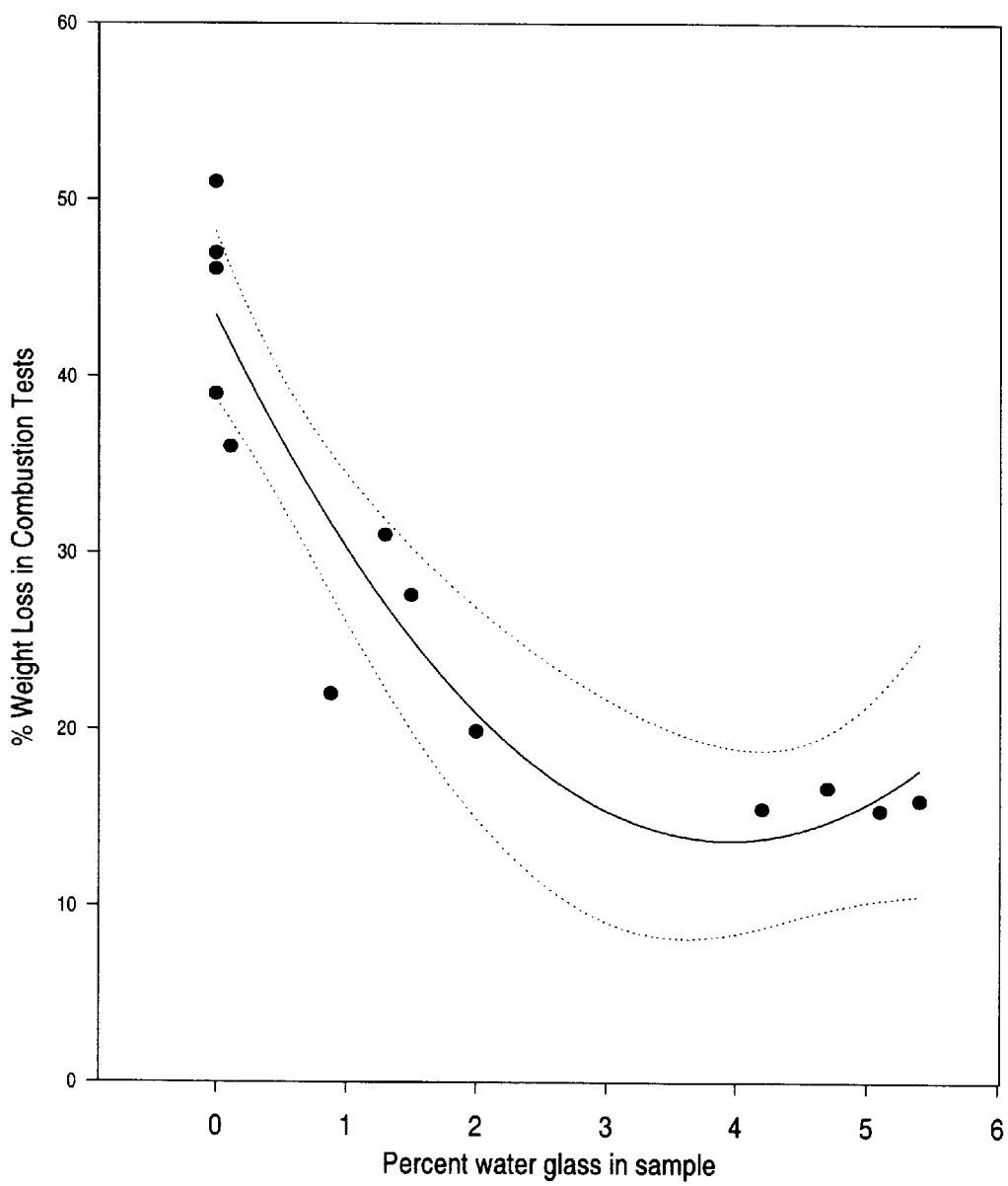
FIG. 3 shows weight loss of samples in flame tests with 1×4 dimension lumber.
Figure 4:
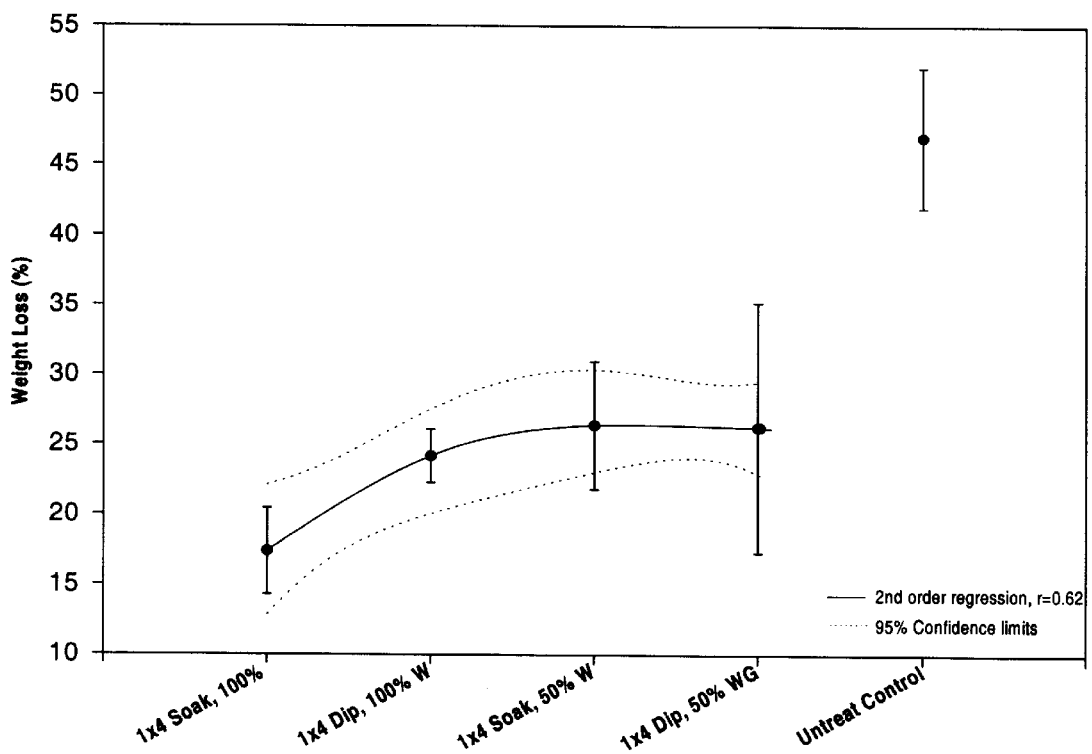
FIG. 4 compares weight per cent water glass and weight per cent burn loss in 1×4 dimension lumber.
Figure 5:
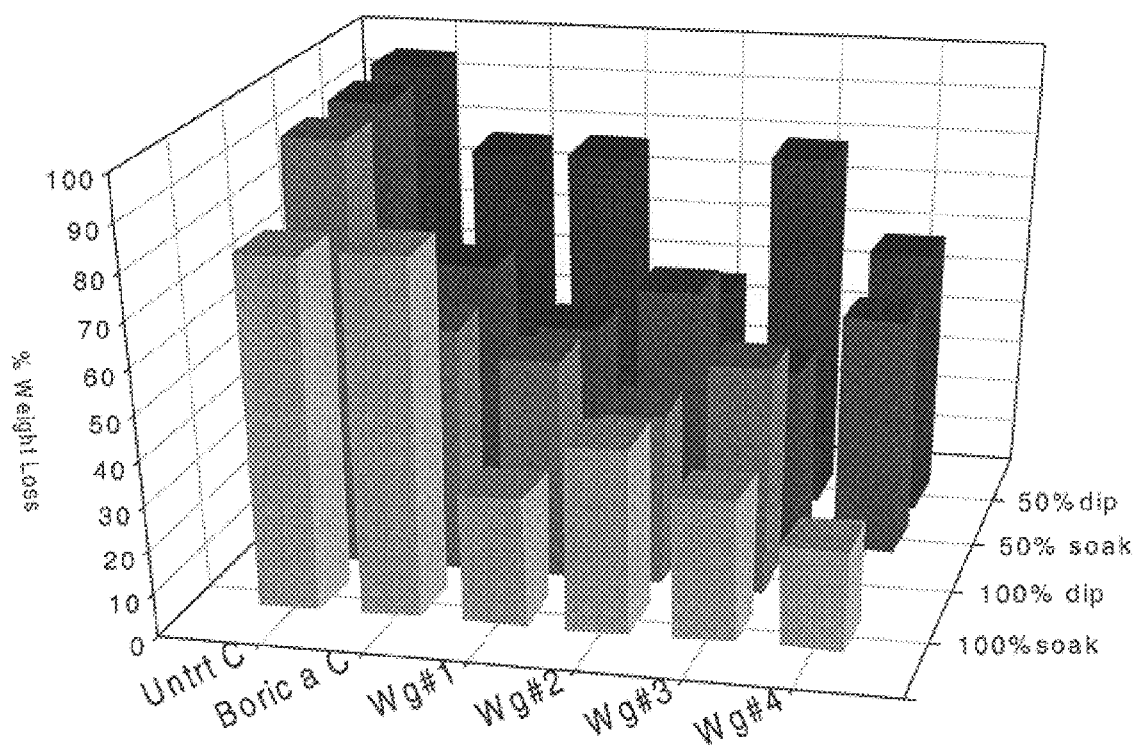
FIG. 5 shows weight loss all samples, 1×4 pine treated with water glass.

FIGS. 3–5 present the results of propane flame tests of sodium silicate treated 1×4 pine samples.

There is a large difference between the untreated control and the test samples. With the untreated controls there ranges from about a 40–38% wt. loss to 50% wt. loss, and with the treated samples, it ranges from about 15% wt. loss to a 25% wt. loss. As FIG. 3 shows, the boric acid test samples have a much greater average % weight loss than the treated samples. This three dimensional set of bar graphs shows how great the difference is with each bar graph colorized and labeled.

Propane Flame Test for 1×4 pine wood sample subjected to a seven-day soak in 100% sodium silicate:

Burn initiation ($T_0$):

The propane flame from the nozzle contacted the wood in an area extending 7 cm laterally and reaching up approximately 27.5 cm. In the first few seconds the flame color was light blue, and relatively difficult to see. In the impact area, the wood began glowing in a small circular area approximately 1 inch sq. Immediately after this, flame color changed from light blue to yellow orange, presumably due to the presence of sodium in sodium silicate traveled outward and upward along a curving line from the initial contact point.

Burn period ($T_{1-20}$):

During this period, the fire continued to remain in the pattern described above, with occasional sparks. The flames did not migrate beyond the flame contact area; however the lower half of the flame contact area was charred. The area at the top edge of the flame flickered orange and below this area the flame was yellow-white in color.

Post burn period ($T_{20-35}$):

After the propane flame was extinguished, the flames died down within 5 seconds; however hot, red glowing embers were observed in the 1 in square area where the heat and flame reached the highest temperature. These embers continued to glow and smolder for approximately 15 minutes. After the embers had cooled a hole, approximately 1 in square was observed at the point of most intense flame application.

On the sides of the wood, white foam bubbled out from the water glass, traveling up the edge of the face of the wood. This area of white foam prevented the spread of flame and char laterally to the side of the wood. One face side of the sample was 83% covered with char and soot. The other face side was 50% covered with char. The color of the char was black, with a thin layer of white foam on the top. There was less cracking of the char than was found on the control. The small sides of the wood remained untouched by either char or fire. The area above the flame reflection took place, had a thin layer of soot in which the underlying wood was unburned. The foaming of the sides took place much greater on the left side of the wood than on the right side. The left side foamed about 90% more than on the right side of the wood. There was observed 0–1% of the small sides burned or charred during the test.

Propane Flame Test for 1×4 pine wood untreated control sample, compared to 1×4 soak, 100% sodium silicate:

Burn initiation ($T_0$):

The propane flame from the nozzle contacted the wood in a 4 cm diameter, then fire spread up the wood in three lines: one in the center of the sample, and the other two growing up the sides. The flame extended 10 cm from the initial point of contact.

Burn Period ($T_{1-20}$):

After two minutes of burning, the flame began to die down to only extending five cm from the initial point of contact. When three minutes and thirty-five seconds had passed, new larger nozzles were added to the tank to increase the amount of fire being applied to the wood. The flame from the larger propane nozzles extended to the top of the wood sample and above it, totaling 29 cm at the greatest height. The flame spread to all sides of the wood, but the small right side received the most amount of fire.

Post Burn Period ($T_{20-35}$):

After the propane tanks were removed from the wood sample, the flames died down within five seconds, leaving two large holes with the outside edges smoldering. The area where the glowing embers were observed was in a ring of about 2 cm around the large hole. There were two large holes in the sample after the burning was finished. The large hole was 8 cm long and 5½ cm wide. The smaller hole was 2 cm long and 4 cm wide. Char extended all of the of the wood that had been above the initial point of contact. The char is dark black to dark brown. The area where the char is has many cracks in it, extending throughout all of the char area. The small left side of the wood is 15% covered with char; on the right side of the wood, the side is 35% covered with char. The char has a layer of soot over it, and rubs off on skin, clothing, or any other casual contact that may occur.

Propane Test for 1×4 pine wood sample subjected to a 1-day dip in 100% sodium silicate:

Burn initiation ($T_0$):

The flame from the nozzle of the propane tank contacted the wood at the bottom of the sample. The flame began to redden an area of 3 $cm^2$, then the flame began to reflect off the wood, with the flame extending 6 cm from the initial point of contact.

Burn Period ($T_{1-20}$):

During this period, the flame reflected off the wood sample. The flame itself did not propagate onto the wood sample. The total height of the flame was about 6 cm high and 3 cm wide. The tops of the flames flickered in the wind.

The sound that the wood made when it was being burned in a new area was that of a sizzling, and occasional popping one. A layer of thin char, or soot grew up the wood above the flame. The layer of ash continued to grow up to the top of the wood. After 10 minutes had passed, the flame died down to a small cinder area around the initial point of contact.

Post Burn Period ($T_{20-35}$):

After the flames from the propane tanks were removed, the flames on the wood died down in a matter of seconds. There were glowing embers around the area where the propane tank had been. The area was 5 cm tall and 6 cm wide at the widest point. The wood is 50% covered in char. The color of the ash is from black to dark brown, except for a layer of white sodium silicate byproduct on top of the char and ash in some areas. Along the sides of the wood there is bubbling from the sodium silicate. The bubbling is 90% greater on the left side than on the right. There is not much charred area on the sides; only about 10% of the sides are burned. There is no burning, charring or soot on the back side of the sample.

Propane Flame Test for 1×4 pine wood untreated control sample, compared to 1×4 dip, 100% sodium silicate:

Burn initiation ($T_0$):

When the flame is first applied to the test sample, flame begins to climb up the sides of the wood, reaching 20 cm off the original burn point. The flame began to slowly travel up the sides of the wood, scorching it and spreading soot and char around the burn site.

Burn period ($T_{1-20}$):

The flame continues to rise 12 cm up the left side of the wood sample. The flame adjusts to the middle of the sample, burning up the sample about 13 cm. The flame chars 70% of the wood, as it buns in the center. The top of the flame flickers and wavers in the wind.

Post burn period ($T_{20-35}$):

The wood sample smolders and burns when the propane tanks are removed. The area of char on the wood extends from the bottom of the sample, to 6 cm below the top of the wood. The fire charred half of the right side of the wood, and over 75% of the left side. In the sample, there were large craters in the wood, where the flame had not eaten all the way through the wood. The craters were: 6 cm×4 cm, and 5 cm×3 cm. The area where the burning took place had large cracks in it, the area where the cracks were extended all the way that the flame did. The top part of the sample that was untouched by flame is covered in a thin layer of soot and ash. The color of the char is a dark black to a dark brown.

FIG. 4 shows that the weight loss of the combustion tests were greater in the samples that had less % water glass impregnated in the test sample. As the % water glass that was in the in the sample increased, the percent weight loss from the combustion test decreased.

FIG. 5 is a second order regression, and it shows the line connecting the data points as the regression line [20], r=0.62. The lines around the regression line [19], 95% Confidence limits, show that 95% of the time, the data will lie within those lines.

EXAMPLE 2

1×4 Pressure Treated Pine—Propane Flame Tests

Figure 6:
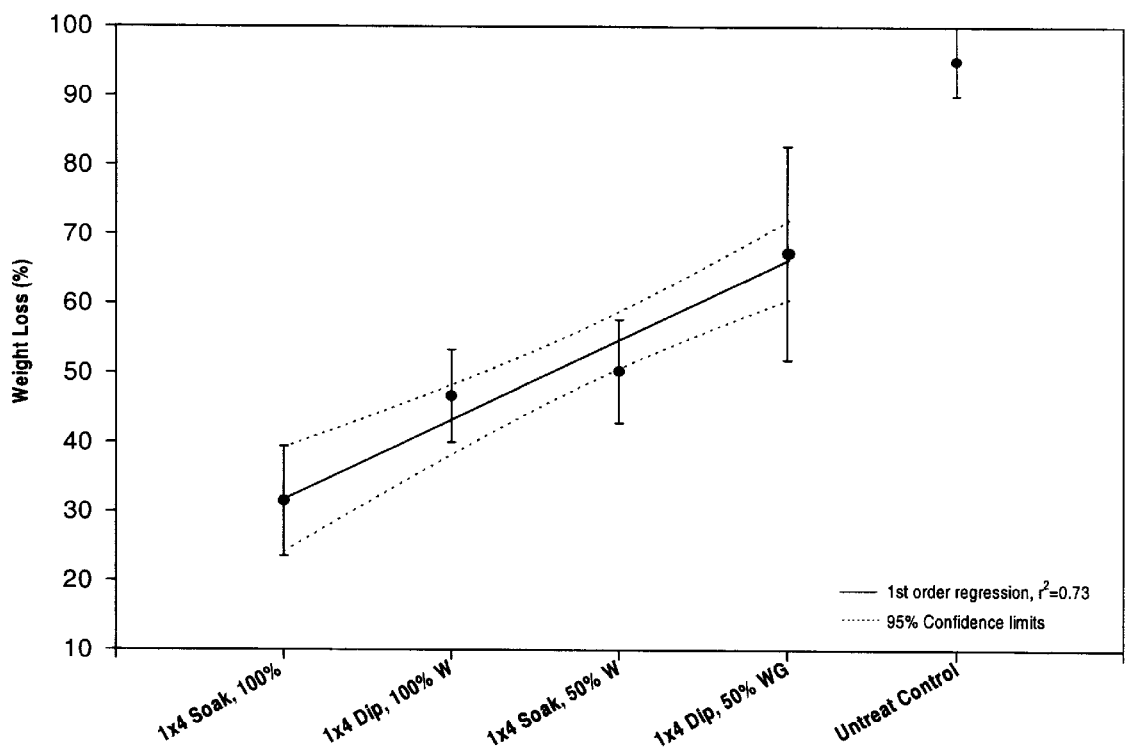
FIG. 6 shows weight loss of samples in flame tests with 1×4 pressure treated lumber.
Figure 7:
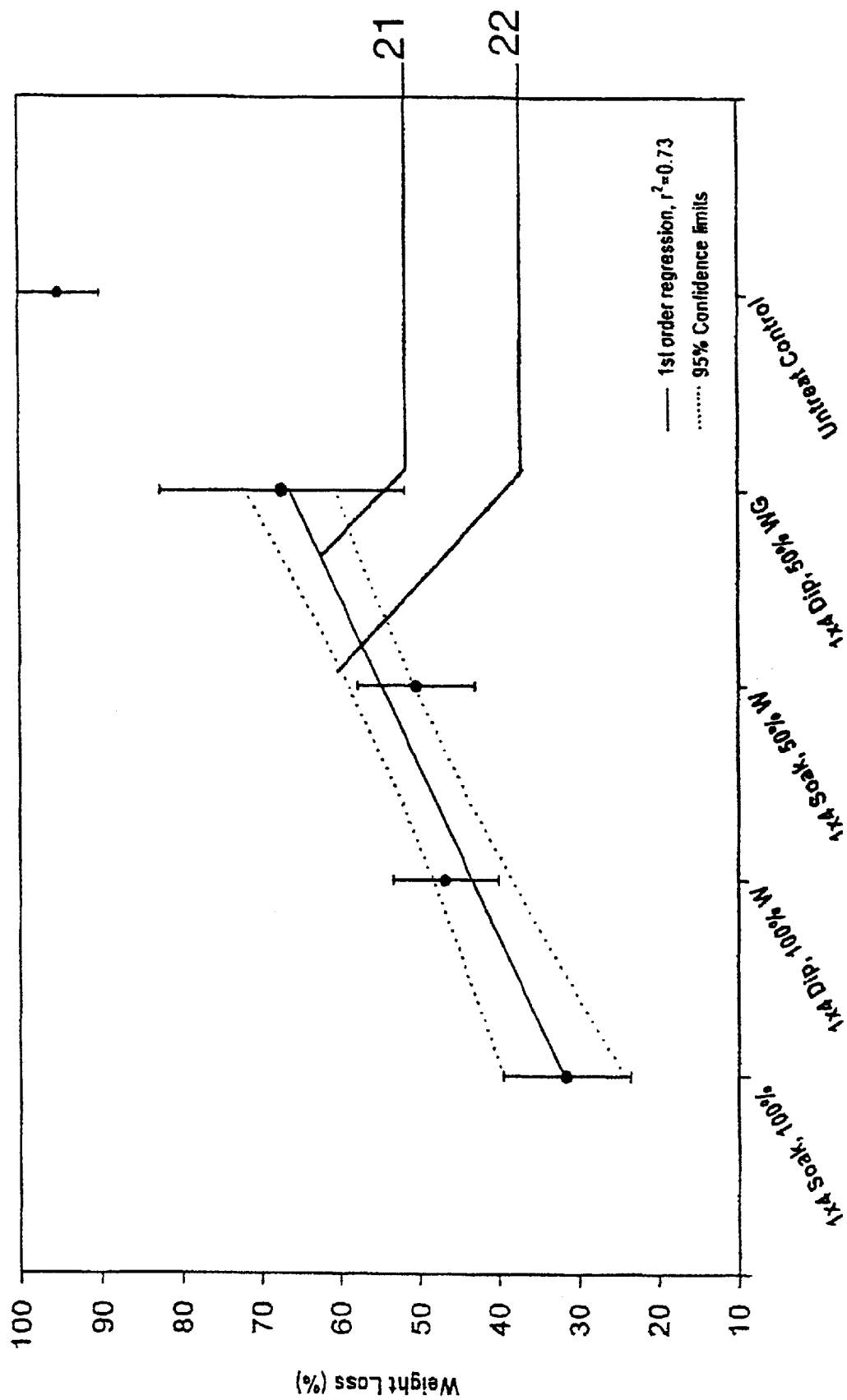
FIG. 7 shows weight loss for all samples, 1×4 pressure treated pine treated with water glass.

FIGS. 6–7 present the results of propane flame tests of sodium silicate treated 1×4 pressure treated pine samples.

FIG. 6 shows how great the % wt. loss was, of the untreated control and the boric acid control, and the water glass treated samples. The data shows that in all cases, the water glass samples performed better than the boric acid control and better than the untreated control.

Propane Test for 1×4 pressure treated pine wood sample subjected to a 1-day dip in 100% sodium silicate:

Burn initiation ($T_0$):

The flame from the propane tank began to reflect off the wood sample. The color of the fire was bright orange. The flame reflection extended 13 cm up from the base of the wood. The flame also began to burn up the right side slightly.

Burn Period ($T_{1-20}$): The flames continue to reflect off the sodium silicate, only reaching 15 cm high. The flames reach the small left side, where it is mostly unprotected. The fire spreads quickly up the side without much treatment, while the other sides continue to repel the attacks from the fire. Later on in the test period, the flame rose, and consumed most of the center of the wood sample.

Post burn period ($T_{20-35}$):

Most of the center section of the wood and the right side has been burned away. There is a small chunk of wood that fell off in burning, but the rest of the missing wood is ash and debris. There was small evidence of the sodium silicate burning, there are 1–2 cm² areas where the sodium silicate has bubbled up into foam, but the foam did no stop the spread of the flame. The part that is missing is 21 cm high and 6 cm wide. The color of the intact wood is black, but in some spots the original dark green color is visible.

Propane Flame Test for untreated control, 1×4 pressure treated pine, compared to dip, 100% sodium silicate, pressure treated pine, 1×4:

Burn initiation ($T_0$):

When the flame was applied to the wood, the wood burst into flame, with the fire reached above and beyond the top of the wood. The spread of the fire took place remarkably fast.

Burn period ($T_{1-20}$):

The flames on the wood continued to grow and propagate. The flames spread up all sides of the wood. Slowly, the wood began losing its shape, ashes fell and the wood began to deteriorate.

Post burn period ($T_{20-35}$):

After the propane tanks were removed, the sample continued to smolder and burn until there was nothing left that it could burn. The cinders kept smoldering for a while, until they died out as well. The remains of the wood sample weighed only about 3% of the original weight. The remains of the sample could be collected in the bottom of a cup. There were no pieces of wood that could still hold a shape; it had all turned to ash. The color of the ash was a light gray.

Propane Test for 1×4 pressure treated pine wood sample subjected to a 7-day soak in 100% sodium silicate:

Burn initiation ($T_0$):

When the flame first touched the wood sample, the flame reflected off the wood and turned bright orange. The wood sizzled and popped. The flame reflected 9 cm from the first point of contact.

Burn period ($T_{1-20}$):

The flame stayed roughly around the same area where it had been when the test started. The flames did grow some, though. The flames spread soot and ash around to other parts of the wood. The wood kept its same shape throughout the burning.

Post burn period ($T_{20-35}$):

The wood sample kept its basic same shape when it was taken away from the flame. Its burn area was a small portion on the bottom of the sample. Most of the sample is still good, firm wood. There is evidence of sodium silicate burning on the edge of the charred parts. The charred parts extended to a few cm short of the top of the wood. Surprisingly, the wood kept its shape.

Propane Flame Test for untreated control, 1×4 pressure treated pine, compared to 7-day soak, 100% sodium silicate, pressure treated pine, 1×4:

Burn initiation($T_0$):

When flame is first applied to the sample, the fire propagates quickly and starts to spread up the sides of the sample. The fire soon quickens, and begins to spread to other parts of the sample.

Burn period ($T_{1-20}$):

The flames on the wood rose, and began to consume the whole sample. The flames extended above the sample, in the air, and the sample began to lose shape quickly. The flames continued to eat away at the burn sample even when the propane tanks were turned off.

Post burn period ($T_{20-35}$):

After the wood sample was separated from the wood, the sample lost its shape and fell apart into a heap of ash. The ash is all that is left of the sample. The ash is all powder with no recognizable parts in it. The ash is dark gray, to light gray.

FIG. 7 shows the % wt. loss compared to each treated sample. This graph (FIG. 7) is a first order regression [22], $r^2$=0.73, bounded by 95% confidence limits [21], which shows that as you lessen the % of water glass you treat the sample with, and shorten the amount of time the samples are introduced to the water glass, the % wt. loss increases.

EXAMPLE 3

2×4 Pine—Propane and Candle Flame Tests

Propane Flame Test for 2×4 spruce sample subjected to a 24-hour dip in 100% sodium silicate:

Burn initiation ($T_0$):

The flame from the propane tank began to make an area of the wood glow. The area that was glowing was 1 inch in diameter. The sample made sizzling and popping noises, and around the burn area, white foam bubbled out of the sodium silicate.

Burn period ($T_{1-20}$):

The flame from the propane tank spread about 3 cm around the initial burn site. No wood propagation occurred in this wood sample. Around and above the burn site, char expanded causing mare sodium silicate to bubble up along the outside of the char area. No flame burned by itself on the wood. Any time that a flame would begin to grow it size, it would die down. Instead of burning, the area around the initial contact point, the area reddened, and glowed in the heat.

Post burn period ($T_{20-35}$):

After the propane flame was removed from the test sample, the wood continued to smolder for a short while. The sample was only changed from the flame in the bottom 15.5 cm. At the contact point of the flame, there was a large crater, 4 cm wide, 3.5 cm long, and 2 cm deep. The walls of the crater are all black, with white foam at ground level of the crater. Above the crater, there is cracked char with a thin layer of sodium silicate foam on the top of it. The foam surrounds all sides of the char. No charring or burning occurred at any of the small sides of the sample. The back side of the sample is completely clear of any burning or charring.

Propane Flame Test for 2×4 spruce untreated control sample, compared to dip, 100% sodium silicate:

Burn initiation ($T_0$):

When the flame from the propane tank reached the wood, it created an area of charring with a 3 cm diameter from the initial point of contact. A small flame began to dance on the top of the char area, but died down with the first gust of wind.

Burn Period ($T_{1-20}$):

The char area increased over time, and small flames would begin to burn, but the flames could not resist the wind. The propane flame did not create a fir that propagated on the wood, all it did was create an area of char, and allow the wood to glow with the heat.

Post burn period ($T_{20-35}$): After the propane flame was removed from the wood sample the flames died down quickly. The wood still smoldered, and gave off lots of smoke. The wood was only burned on the front side of the sample. There were two craters in the wood, and a large area of char surrounding them. The charred areas extended from the base of the wood sample to 19 cm above it. The char was a dark black and had many cracks in it.

EXAMPLE 4

Composite Samples—Propane Flame Tests

Figure 8:
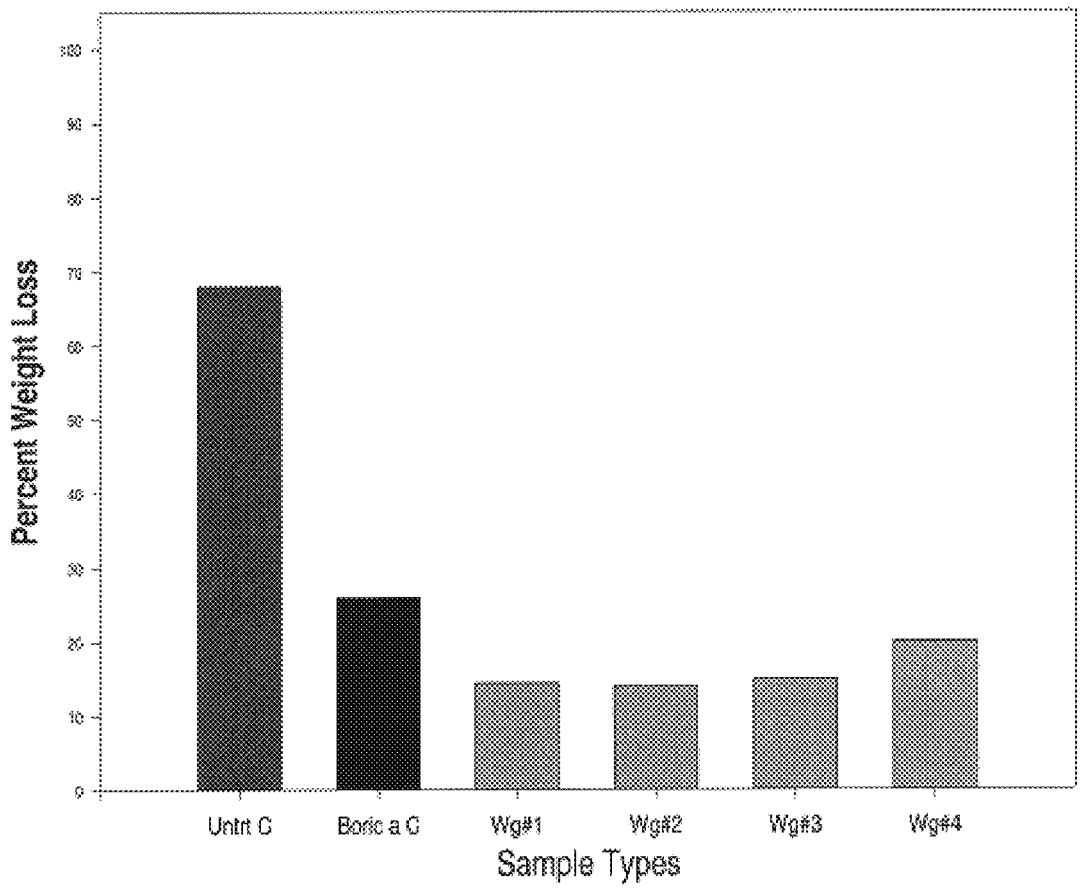
FIG. 8 shows fire retardant effect of water glass on plywood.
Figure 9:
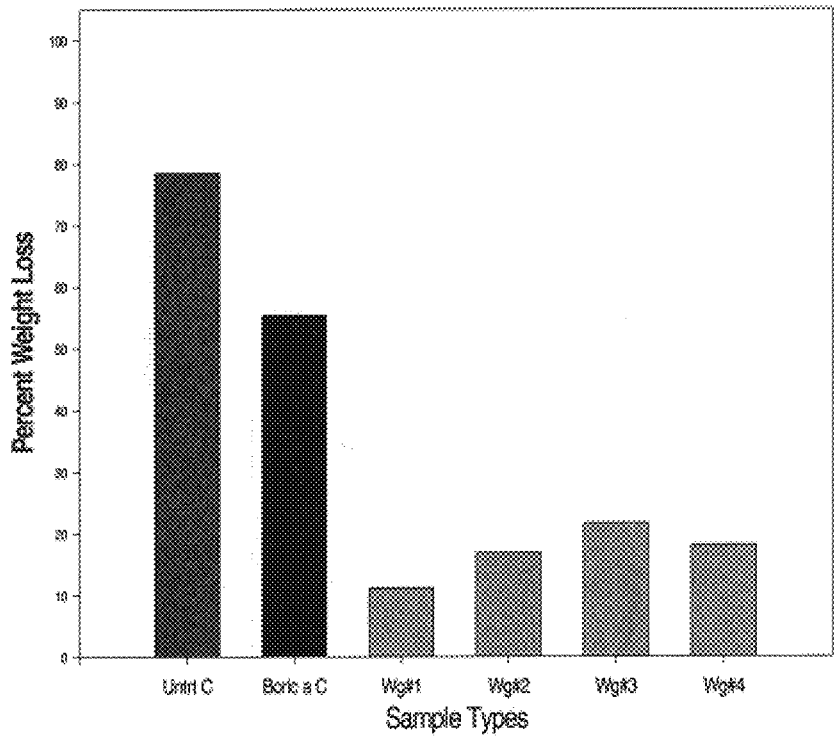
FIG. 9 shows fire retardant effect of water glass on particleboard.
Figure 10:
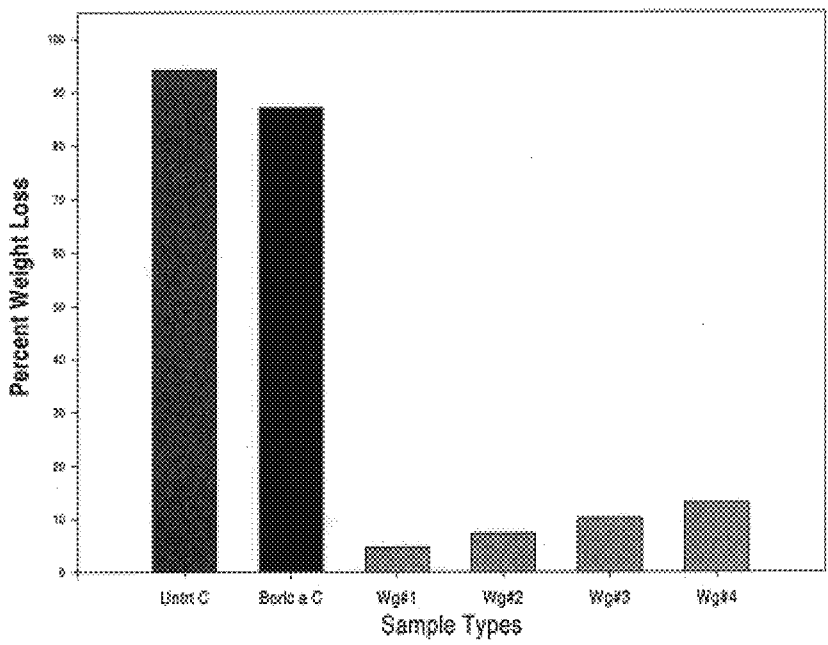
FIG. 10 shows fire retardant effect of water glass on wafer board.

FIGS. 8–10 present the results of propane flame tests of sodium silicate treated composite wood samples.

FIG. 8 shows the % wt. loss compared to the sample of plywood. The untreated control has a much greater % wt. loss than the boric acid or treated control. In this test run, the treated samples had a lower % wt. loss than either the boric acid control, or the untreated control.

FIG. 9 shows the % wt. loss compared to the different sample types. This graph shows the large difference between the controls and the test samples. The test sample had a much lower % weight loss than either the boric acid control or the untreated control.

FIG. 10 shows the % wt. loss compared to the different types of samples. In this test the treated samples had a much lower % wt. loss than either the boric acid or untreated control. The water glass treated samples have a much lower flame retardancy than either control.

EXAMPLE 5

Cloth Samples—Candle Flame Tests

Figure 11:
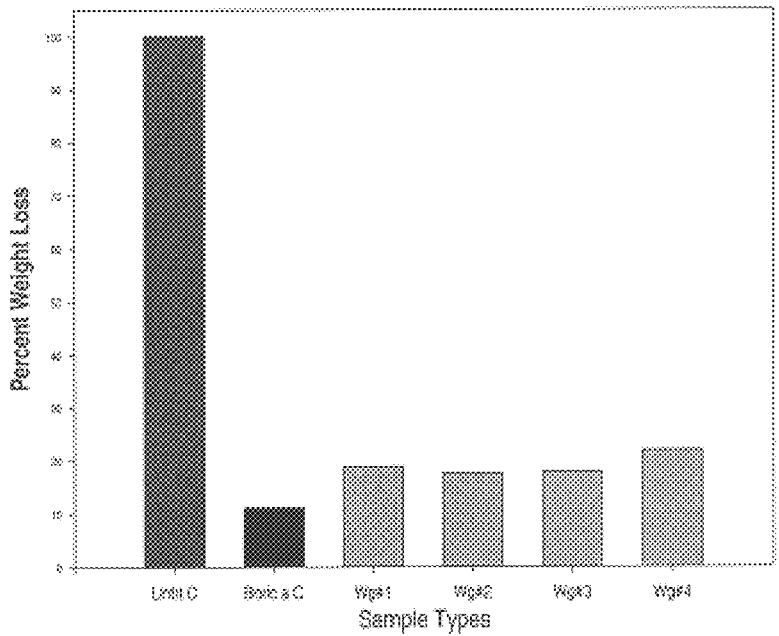
FIG. 11 shows fire retardant effect of water glass on cloth strips.
Figure 12:
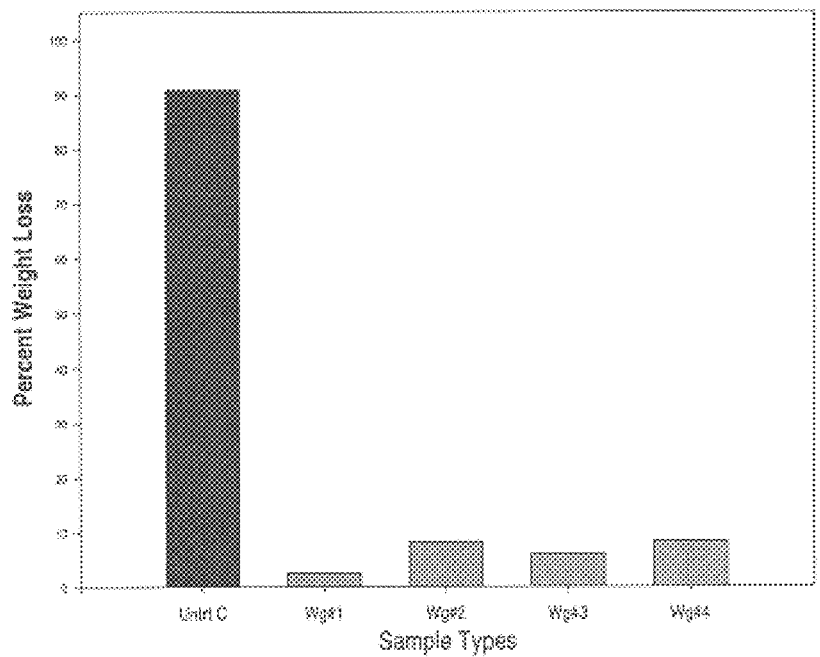
FIG. 12 shows fire retardant effect of water glass on slurried cloth strips.
Figure 13:
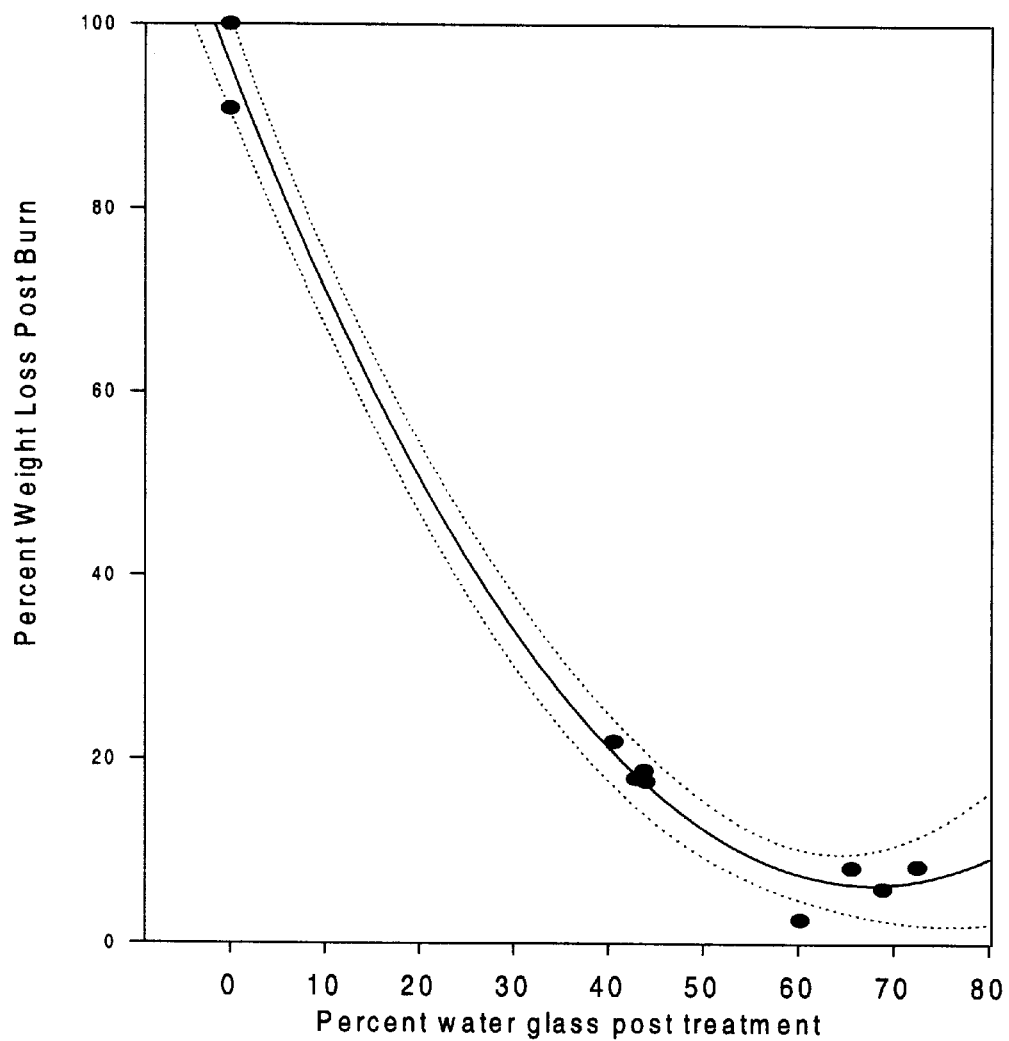
FIG. 13 compares weight per cent water glass and fire retardant effect in cloth.

FIGS. 11–13 present the results of propane flame tests of sodium silicate treated cloth samples.

FIG. 11 shows that the untreated control had almost 100% wt. loss. In this test, the boric acid sample had the lowest % weight loss. All of the treated samples had a much lower % wt. loss than the control.

In FIG. 12 there is no boric acid sample. This graph shows how dramatic the results are. The control had about a 90% wt. loss, and the samples, at most had about an 11% wt. loss Candle Test-Fabric:

Treated sample:

Charring in the spot directly in the flame, smoke production. Flame does not spread. The felt is getting cracks in the flame area. The area in direct contact with flame is getting bubbles. Smoke occurs only when in the flame. No flame propagation occurred in the test.

Control sample:

The burning started to propagate on the sample immediately. The smoke given off was white. The flames reached about 2 inches off of the sample. The burning did not occur as fast as would have been forecasted. The sample did not catch fire as much as the charring just spread.

FIG. 13 shows the 95% confidence limit lines, which shows that as the amount of water glass in the sample increases, the % wt. loss decreases. This shows that the sodium silicate has a major effect on the burn characteristics of the samples.

EXAMPLE 6

Paper Samples—Candle Flame Tests

FIGS. 14–18 present the results of propane flame tests of sodium silicate treated 1×4 pine samples.

Candle Test—Paper:

Treated sample:

The flame darkens the paper, but doe not catch fire. The paper sizzles and cracks in response to the fire. The paper itself does not catch fire, but does release a lot of smoke. The area of char does not go past the initial contact point with the paper. At the points on the paper that are in direct contact with the flame, It begins to redden, but does not catch fire. The paper thickens as heat is applied to it. It takes the fire 5 min 33 sec before it can do all of its work.

Figure 14:
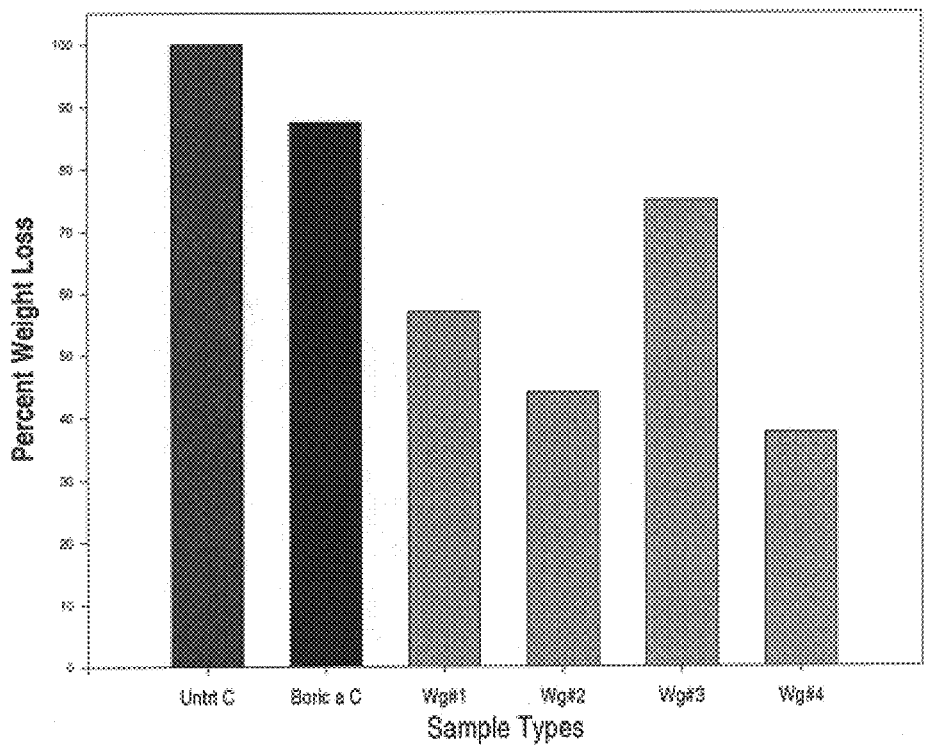
FIG. 14 shows fire retardant effect of water glass on paper.

FIG. 14 shows the % wt. loss compared to the different sample types. This test shows how the sodium silicate treated samples have a much less % wt. loss than the boric acid and untreated controls.

Figure 15:
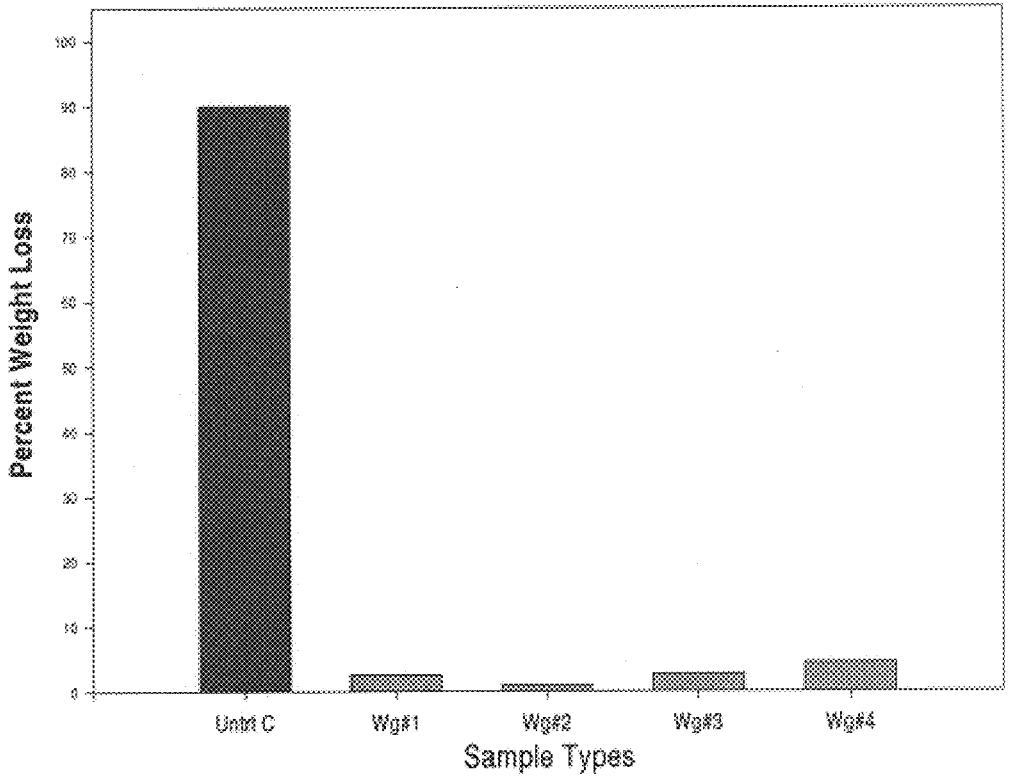
FIG. 15 shows fire retardant effect of water glass on slurried paper.

FIG. 15 shows the % wt. loss compared to the different sample types. There is no boric acid control in this test. This test run shows how much greater weight the control loses than the treated samples. This graph is an excellent example of how sodium silicate effects burn characteristics.

Control sample:

The flame started up the paper immediately, spreading quickly up the paper. The fire elevated to ½ of an inch above the paper, the total burn time for the paper to become consumed lasted 17 seconds. The final weight was too small to measure.

Figure 16:
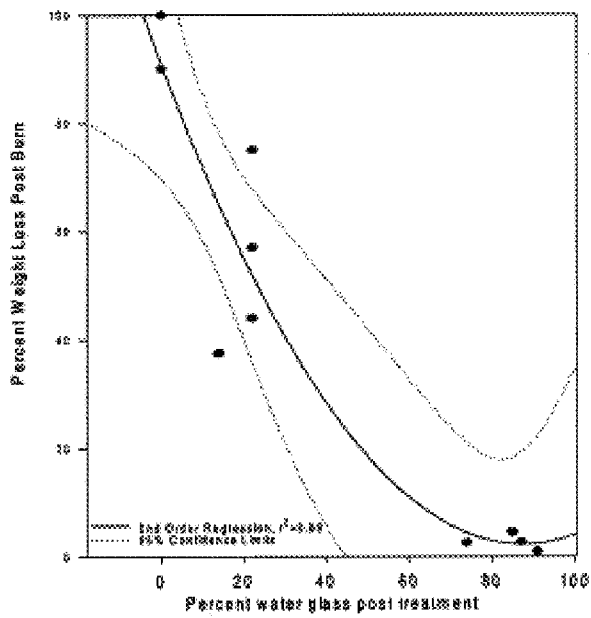
FIG. 16 compares weight percent water glass and fire retardant effect in paper.

FIG. 16 shows % wt loss after burn, compared to the percent water glass after treatment. The graph shows that as the amount of sodium silicate in the sample increases, the % wt loss from burn decreases as a second order regression, $r^2=0.89$ [24], with the 95% confidence limits shown [23]. This can show that sodium silicate has a positive effect on the burn characteristics of paper.

Figure 17:
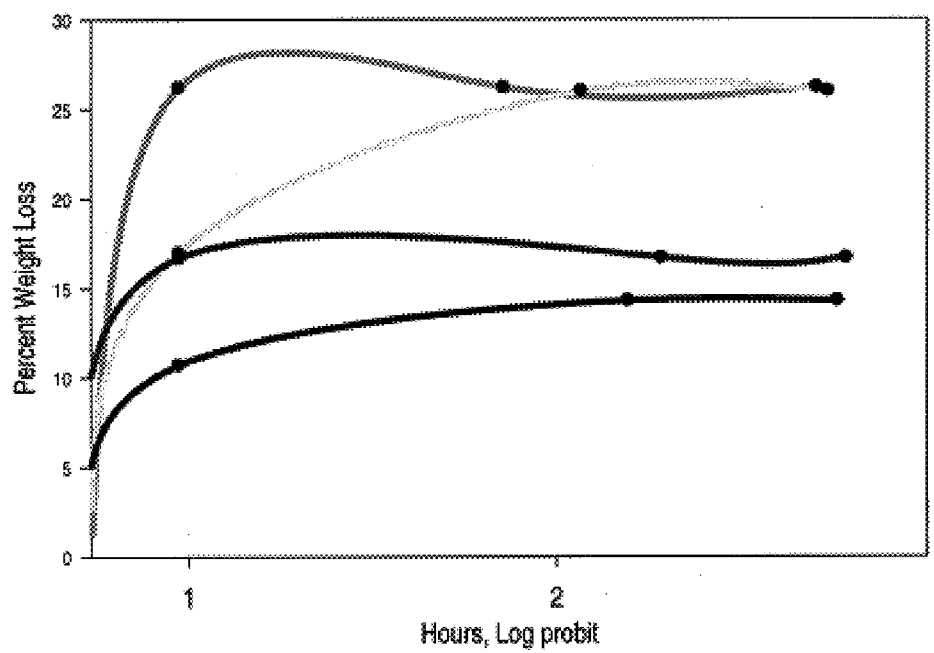
FIG. 17 shows paper slurry with water glass: per cent weight loss over time.

FIG. 17 shows the burn cycle over a 2-hour period. The graph shows that when the flame is first applied, weight loss increases rapidly. After about 20 min the weight loss begins to taper off and continues in an almost straight line.

Figure 18:
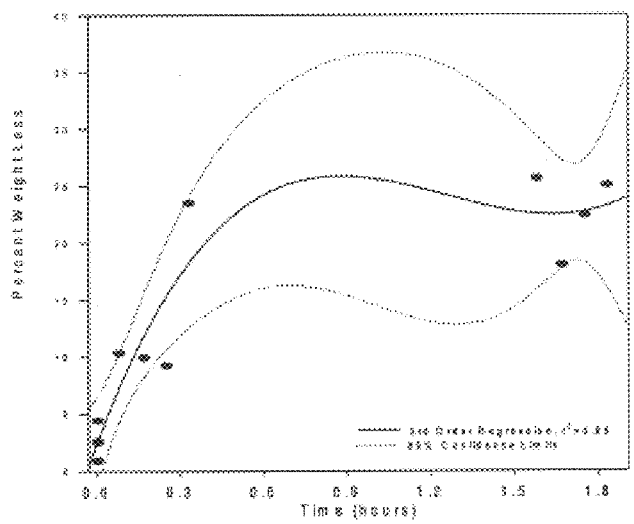
FIG. 18 shows paper slurry with water glass: percent weight loss over time.

FIG. 18 is similar to that of FIG. 17. It shows the burn cycle of the flames in a 2-hour period. This graph is a third order regression, $r^2=0.88$, [26] with 95% confidence limits shown [25], which shows the path of the burn characteristics.

EXAMPLE 7

1×4 Pine Cubes—Termite Tests

To test another benefit of sodium silicate wood treatment, I soaked small pieces of wood in sodium silicate and introduced them to termites to see if the same quality that makes the wood flame resistant would also make the wood termite resistant. I found that the termites did not like to be around the water glass treated wood, and they did not even like to be around the damp paper towels in the test samples, which may have contained small amounts of water glass. The termites located themselves in an area as far away from the treated samples as possible, even though the treated wood was their only food source. No wood consumption occurred.

EXAMPLE 8

Summary Of Results—All Samples

Figure 19:
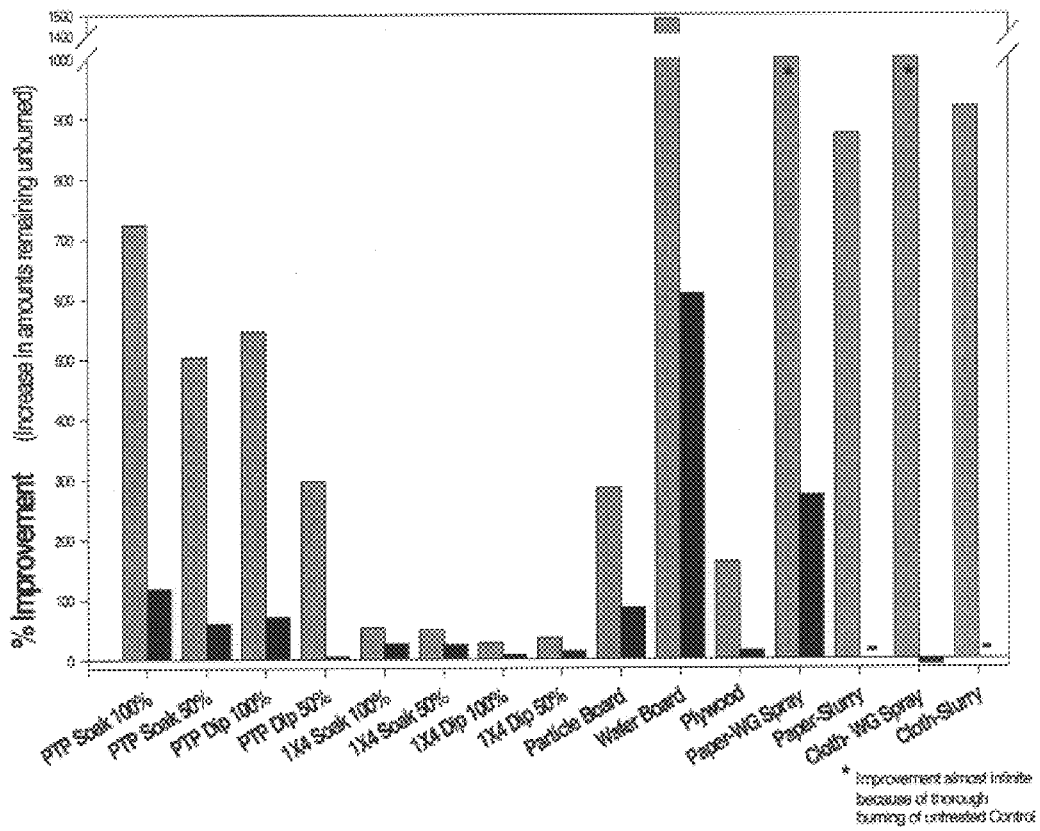
FIG. 19 compares water glass results to controls.
Figure 20:
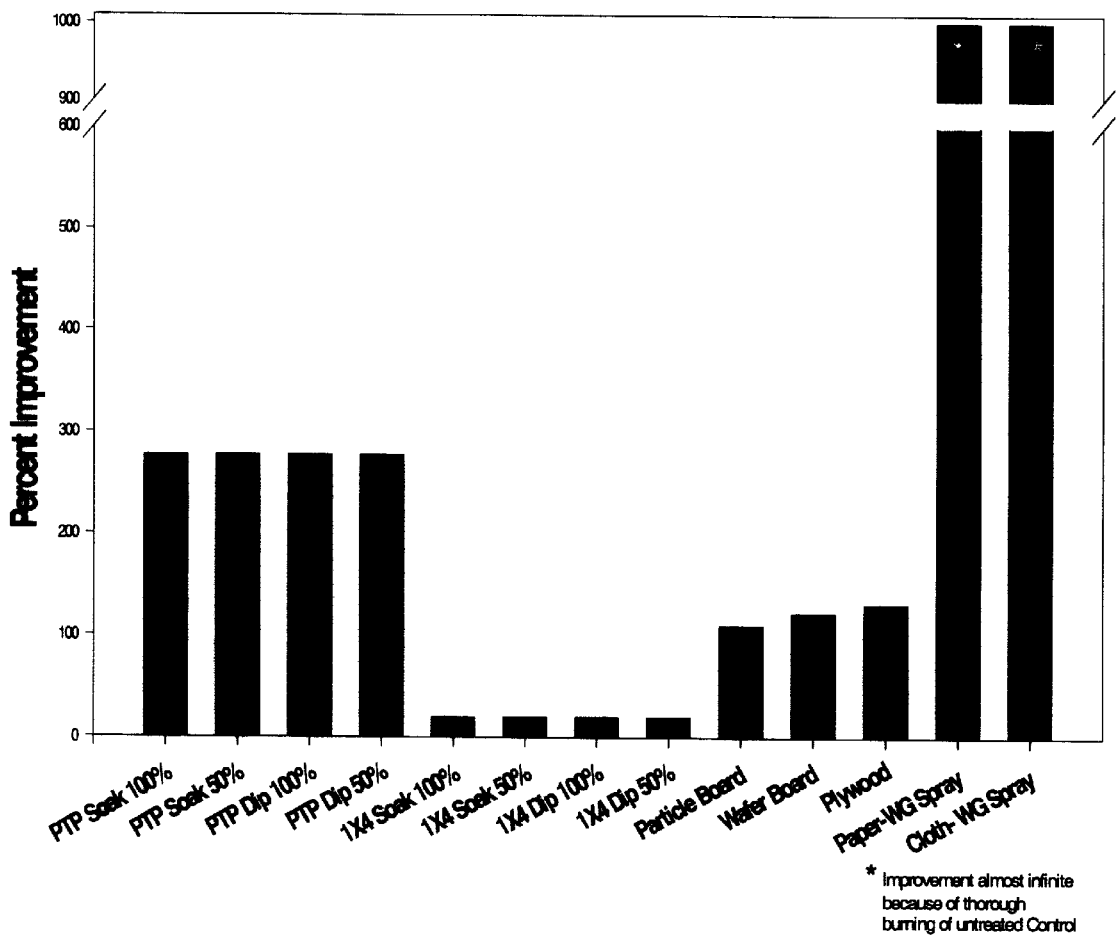
FIG. 20 compares boric acid results to untreated control.
Figure 21:
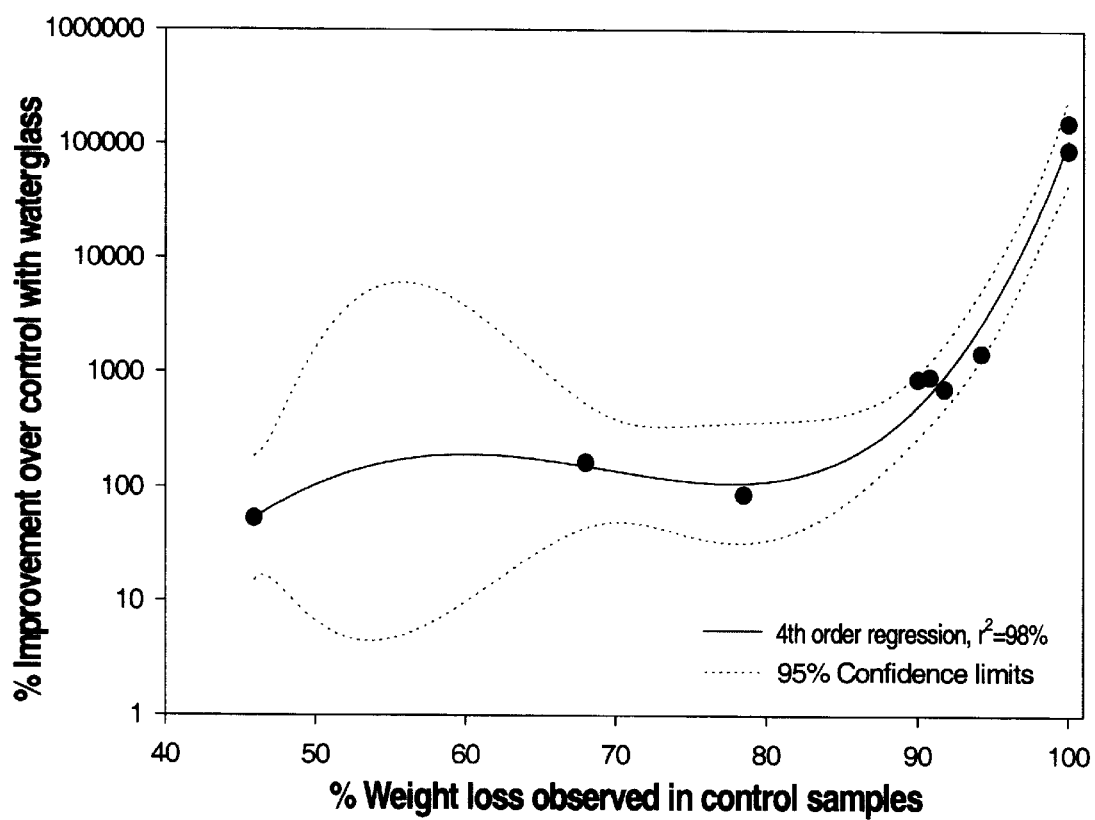
FIG. 21 shows the relationship between increasing flammability in control samples and increasing effectiveness in water glass treated samples.

FIGS. 19–21 and Tables 2–4 present comparisons of the results obtained with all samples tested. For FIGS. 19 and 20, some samples showed an improvement almost infinite because of thorough burning of the untreated control, these are indicated by [27].

FIG. 19 shows the % improvement of the test sample over the control. In the graph, the blue lines represent the boric acid, and the green lines represent the sodium silicate treated samples. The graph shows that sodium silicate is a more effective fire retardant than boric acid/borax.

FIG. 20 shows the % improvement of the boric acid samples over the control. This graph shows that the boric acid is a somewhat effective fire retardant treatment.

FIG. 21 compares % wt. loss observed in control samples (x-axis)-, with % improvement over control with waterglass (y-axis). A correlation as a fourth order regression ($r^2=98\%$) [29] with the 95% confidence limits shown [28] was found.

TABLE 2

Comparison of Water Glass and Untreated Control

| | Weight Loss Comparisons | | | | Comparisons of Amounts Unburned | | | |
|---|---|---|---|---|---|---|---|---|
| Sample Type | Percentage reduction in weight loss | # times better than control | Percent better than control | Percent improvement | Average amount unburned (control) | Average amount unburned (treated) | Number of times better than control | Percent improvement |
| | 1×4 Pressure treated pine samples | | | | | | | |
| Soak-100% WG | 59.75 | 2.87 | 287% | 187 | 8.25 | 68 | 8.24 | 724% |
| Soak-50% WG | 41.5 | 1.825 | 183% | 83% | 8.25 | 49.75 | 6.03 | 503% |
| Dip 100% WG | 45.08 | 1.97 | 197% | 97% | 8.25 | 53.33 | 6.46 | 546% |
| Dip-50% WG | 24.5 | 1.36 | 136% | 36% | 8.25 | 32.75 | 3.97 | 297% |
| | 1×4 Pine Samples (Not pressure treated) | | | | | | | |
| Soak-100% WG | 28.53 | 2.64 | 264% | 164% | 54.1 | 82.63 | 1.53 | 53% |
| Soak-50% WG | 27.1 | 2.44 | 244% | 144% | 54.1 | 81.2 | 1.5 | 50% |
| Dip 100% WG | 15.63 | 1.52 | 152% | 52% | 54.1 | 69.73 | 1.28 | 28% |
| Dip 50% WG | 19.65 | 1.75 | 175% | 75% | 54.1 | 73.75 | 1.36 | 36% |
| | Composite Products | | | | | | | |
| Particle board | 61.5 | 4.61 | 461% | 361% | 21.5 | 83 | 3.86 | 286% |

TABLE 2-continued

Comparison of Water Glass and Untreated Control

| | Weight Loss Comparisons | | | | Comparisons of Amounts Unburned | | | |
|---|---|---|---|---|---|---|---|---|
| Sample Type | Percentage reduction in weight loss | # times better than control | Percent better than control | Percent improvement | Average amount unburned (control) | Average amount unburned (treated) | Number of times better than control | Percent improvement |
| Wafer board | 85.45 | 10.76 | 1076% | 976% | 5.8 | 91.52 | 15.78 | 1477% |
| Plywood | 52.13 | 4.28 | 428% | 328% | 32 | 84.13 | 2.63 | 163% |
| Paper and Cloth Products | | | | | | | | |
| Paper Spray | 46.63 | 1.87 | 187% | 87% | .03 | 46.63 | 1554 | 155333% |
| Paper Slurry | 87.4 | 34.61 | 3461% | 3361% | 10 | 97.4 | 9.74 | 874% |
| Cloth Spray | 80.95 | 5.24 | 524% | 424% | 0.09 | 80.95 | 899 | 89844% |
| Cloth Slurry | 84.49 | 14.38 | 1438% | 1338% | 9.2 | 93.69 | 10.18 | 918% |

TABLE 3

Comparison of Water Glass and Boric Acid

| | Weight Loss Comparisons | | | | Comparisons of Amounts Unburned | | | |
|---|---|---|---|---|---|---|---|---|
| Sample Type | Percentage reduction in weight loss | # times better than control | Percent better than control | Percent improvement | Average amount unburned (control) | Average amount unburned (treated) | Number of times better than control | Percent improvement |
| 1x4 Pressure treated pine samples | | | | | | | | |
| Soak-100% WG | 36.85 | 2.15 | 215% | 115% | 31.15 | 65 | 2.18 | 118% |
| Soak-50% WG | 18.6 | 1.37 | 132% | 37% | 31.15 | 49.75 | 1.60 | 60% |
| Dip 100% WG | 22.18 | 1.47 | 1475 | 47% | 31.15 | 53.33 | 1.71 | 71% |
| Dip-50% WG | 1.6 | 1.02 | 102% | 2% | 31.15 | 32.75 | 1.05 | 5% |
| 1x4 Pine Samples (Not pressure treated) | | | | | | | | |
| Soak-100% WG | 17.4 | 2.00 | 200% | 100% | 65.23 | 82.63 | 1.26 | 26% |
| Soak-50% WG | 15.97 | 1.85 | 185% | 85% | 65.23 | 81.2 | 1.24 | 24% |
| Dip 100% WG | 4.5 | 1.15 | 115% | 15% | 65.23 | 69.73 | 1.07 | 7% |
| Dip 50% WG | 8.52 | 1.32 | 132% | 32% | 65.23 | 73.75 | 1.13 | 13% |
| Composite Products | | | | | | | | |
| Particle board | 38.4 | 3.26 | 326% | 226% | 44.6 | 83 | 1.86 | 86% |
| Wafer board | 78.35 | 9.95 | 995% | 895% | 12.9 | 91.52 | 7.09 | 609% |
| Plywood | 10.13 | 1.64 | 164% | 64% | 74 | 84.13 | 1.14 | 14% |
| Paper and Cloth Products | | | | | | | | |
| Paper Spray | 134.13 | 1.64 | 164% | 64% | 12.5 | 46.63 | 3.73 | 273% |
| Paper Slurry | — | — | — | — | — | — | — | — |
| Cloth Spray | −7.95 | 0.58 | 58% | −42% | 88.9 | 80.95 | 0.91 | −9% |
| Cloth Slurry | — | — | — | — | — | — | — | — |

TABLE 4

Comparison of Boric Acid and Untreated Control

| | Weight Loss Comparisons | | | | Comparisons of Amounts Unburned | | | |
|---|---|---|---|---|---|---|---|---|
| Sample Type | Percentage reduction in weight loss | # times better than control | Percent better than control | Percent improvement | Average amount unburned (control) | Average amount unburned (treated) | Number of times better than control | Percent improvement |
| 1x4 Pressure treated pine samples | | | | | | | | |
| Soak-100% WG | 22.9 | 1.33 | 133% | 33% | 8.25 | 31.15 | 377 | 277% |
| Soak-50% WG | 22.9 | 1.33 | 133% | 33% | 8.25 | 31.15 | 377 | 277% |
| Dip 100% WG | 22.9 | 1.33 | 133% | 33% | 8.25 | 31.15 | 377 | 277% |
| Dip-50% WG | 22.9 | 1.33 | 133% | 33% | 8.25 | 31.15 | 377 | 277% |

TABLE 4-continued

Comparison of Boric Acid and Untreated Control

| | Weight Loss Comparisons | | | | Comparisons of Amounts Unburned | | | |
|---|---|---|---|---|---|---|---|---|
| Sample Type | Percentage reduction in weight loss | # times better than control | Percent better than control | Percent improvement | Average amount unburned (control) | Average amount unburned (treated) | Number of times better than control | Percent improvement |
| 1x4 Pine Samples (Not pressure treated) | | | | | | | | |
| Soak-100% WG | 11.13 | 1.32 | 132% | 32% | 54.1 | 65.23 | 1.2 | 20% |
| Soak-50%WG | 11.13 | 1.32 | 132% | 32% | 54.1 | 65.23 | 1.2 | 20% |
| Dip 100% WG | 11.13 | 1.32 | 132% | 32% | 54.1 | 65.23 | 1.2 | 20% |
| Dip 50% WG | 11.13 | 1.32 | 132% | 32% | 54.1 | 65.23 | 1.2 | 20% |
| Composite Products | | | | | | | | |
| Particle board | 23.1 | 1.34 | 134% | 34% | 21.5 | 44.6 | 2.1 | 110% |
| Wafer board | 7.1 | 1.08 | 108% | 8% | 58 | 12.9 | 2.22 | 122% |
| Plywood | 42 | 2.61 | 261% | 161% | 32 | 74 | 2.31 | 131% |
| Paper and Cloth Products | | | | | | | | |
| Paper Spray | 12.5 | 1.14 | 114% | 145% | 0.03 | 12.5 | 416.66 | 41566% |
| Paper Slurry | — | — | — | — | — | — | — | — |
| Cloth Spray | 88.9 | 9.00 | 900% | 800% | 0.09 | 88.9 | 987.77 | 98677% |
| Cloth Slurry | — | — | — | — | — | — | — | — |

The percent weight loss for regular 1×4s and 2×4s was lower than for pressure treated pine. This was probably due to the fact that the results were obtained under different burn conditions. These tests were performed outdoors where it was windy and very cold, also only one torch was used with a very small flame. If I were to repeat the test using the conditions for the pressure treated pine samples, I would expect the results to be similar to those for pressure treated pine samples.

EXAMPLE 9

Microscopic Evaluation

The goal for the microscopic examinations was to determine the distribution pattern of sodium silicate throughout the materials tested in order to determine whether sodium silicate distribution varies as the application technique and concentration is varied, and to determine whether the fire retardant properties observed for sodium silicate are exclusively due to the protective effect of a surface coating, or whether other mechanisms may also apply, to determine whether sodium silicate was able penetrate into pores of the wood or also able to enter and alter cellular structures.

Figure 22:
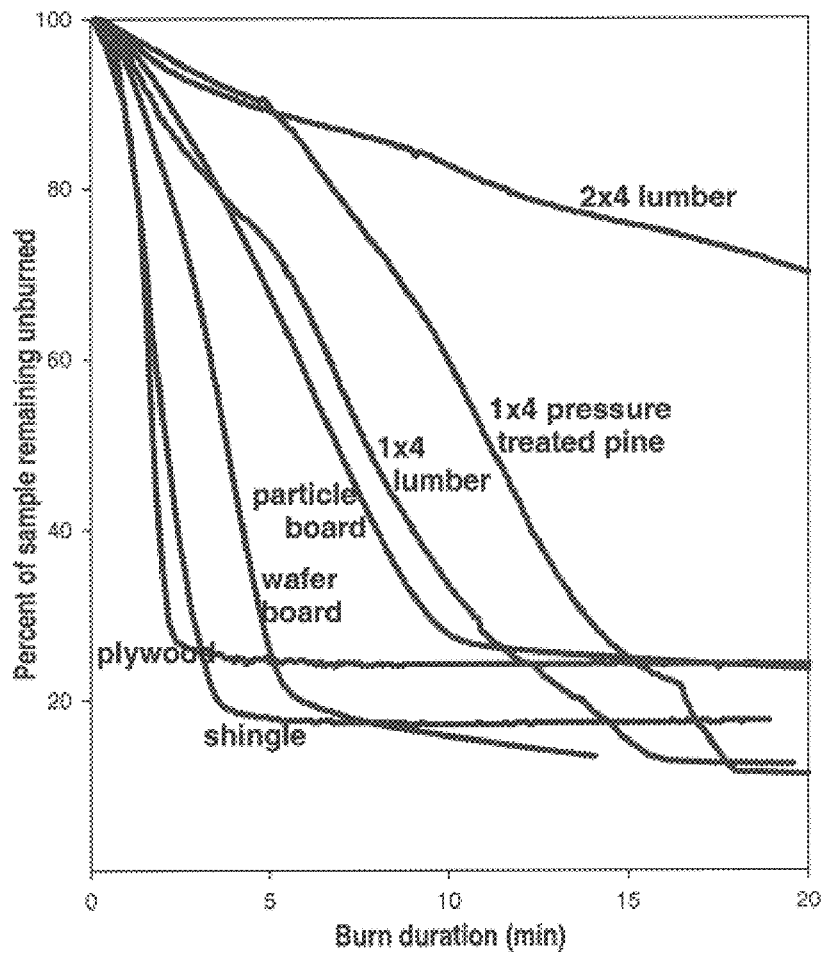
FIG. 22 shows a cross section of yellow pine sample soaked in 300 g/kg aqueous sodium silicate, and shows sodium silicate spreading inward through cellular structures.

Cross sections of yellow pine samples treated with 300 g/kg sodium silicate solution were examined at 30× using a Nikon dissecting stereoscope. FIG. 22 presents the cross section view of a yellow pine sample treated with 300 g/kg sodium silicate solution. In FIG. 22 sodium silicate can be clearly seen as a layer at the surface that extends into the interior in a crevice in the wood, and also can be seen to have spread into the cellular structures in the interior of the sample, note the white, crystal like areas throughout the sample.

EXAMPLE 10

Thermochemistry

In addition to the studies examining the flame retardant properties of sodium silicate treated samples in flame tests described above, sodium silicate foam-like material form during the above reported flame tests was investigated. Two areas of investigation were undertaken: 1) chemical composition of the sample formed during flame tests, and 2) solubility of the material formed as a function of temperature of flame or heat.

Figure 23:
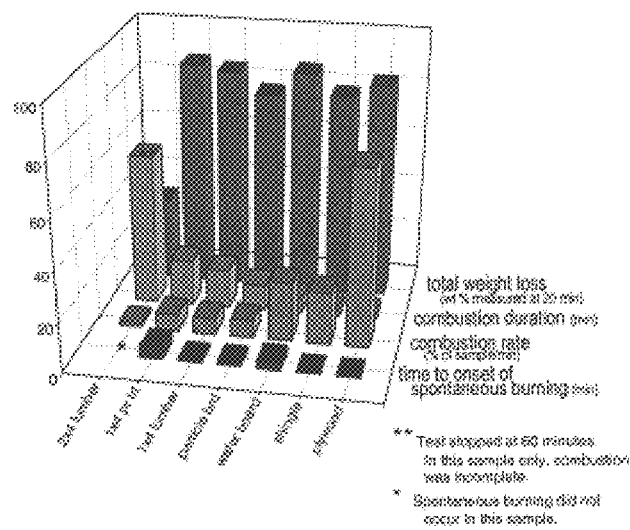
FIG. 23 shows results of X-ray crystallography examination of sodium silicate fragment modified by heat at 620° C., showing non crystalline structure present.
Figure 24:
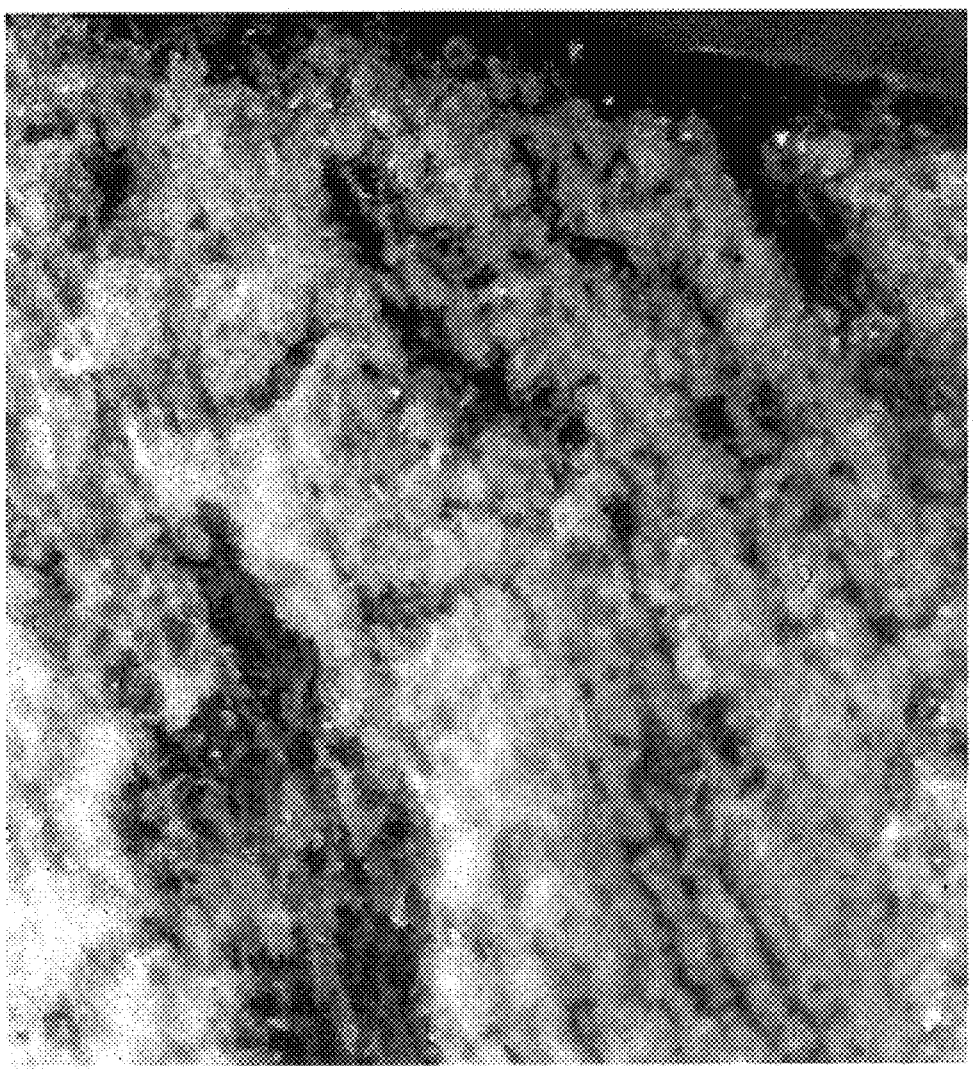
FIG. 24 shows results of examination by x-ray photoelectron spectrometry of sodium silicate fragment modified by heat at 620° C., showing the elemental composition.

To know for certain that the material formed in flame tests was not a crystalline substance, the sample was examined using x-ray crystallography. FIG. 23 presents these results which definitely show that the material is not crystalline in structure. The hardened, foam-like material was then examined using. This method was chosen because it would be definitely possible to determine the elemental composition of the material and because it is sometime possible to determine the structure of large molecules using this method. The results of x-ray photoelectron spectrometry are presented in FIG. 24. The data show that the material is composed of sodium, oxygen, silicon, when a harden layer of sodium silicate that had not been subjected to heat was analyzed, the results were virtually identical to those shown in FIG. 24, in peak height and intensity. It was not possible to characterize the heat treated sample further, apparently due to the very large size of the molecules. Attempts to further understand the characteristics of the heat treated sodium silicate material, then emphasized water solubility studies.

Water solubility of sodium silicate is well documented in the published literature (Hawley 1971). This investigator has observed that sodium silicate dissolves more slowly after it has hardened into a glassy layer, but does eventually dissolve in agreement with the literature. Sodium silicate was found to be especially soluble in hot or boiling water. At 100° C. a hardened sample of sodium silicate dissolved completely in less than 20 seconds. In samples treated with 400 g/kg sodium silicate by soaking for 7 days and then drying and storing, that were placed in distilled water at 100° C., all sodium silicate on the surface and in the interior of the samples was dissolved within 60 seconds.

Figure 25:
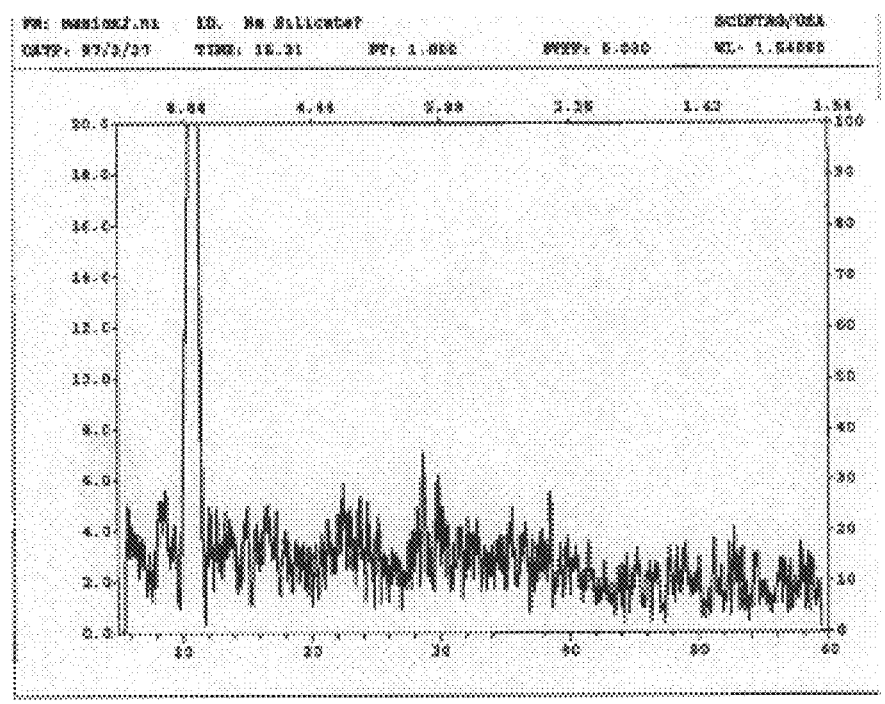
FIG. 25 shows the effect of temperature on solubility of sodium silicate.

To further study the solubility of sodium silicate treated wood; popsicle sticks soaked with 400 g/kg of sodium silicate were exposed to heat, for five minutes. The sodium silicate treated samples were heated to 650° C., 260° C., 205° C., and 150° C. The heat treated samples were placed in boiling water, and disappearance of sample was used as an indication of solubility. FIG. 25 shows the effect of temperature on solubility of sodium silicate. The dashed line [30] reports the hours required to dissolve sodium silicate vs the heating temperature of the sodium silicate heat-treated samples. The solid line [31] shows the percent of sodium silicate sample dissolving vs the heating temperature of the sodium silicate heat-treated samples. FIG. 25 shows that as the temperature increased, the time to dissolve increased as well. The graph also showed that as temperature decreased, the percent dissolution (read on the right scale) increased.

This data definitely shows that although the substances before and after burning are composed of the same elements in similar proportions, the water solubility of the substances is very different. A possible explanation for this obvious difference in properties is that as a result of the application of heat, the sodium silicate undergoes dehydration (loss of water) and a process of polymerization that forms increasingly larger moieties of $(SiO_4)_n^{-1}$ while still maintaining an overall charge of −1 that forms an association with the free sodium. As the material polymerizes the resultant material increases in size to the point that it is no longer able to dissolve in water, thus becoming insoluble. At lower temperatures, the process would occur to various degrees based on the temperatures and the duration of exposure, thus providing a possible explanation for the partial solubilities observed in FIG. 25.

EXAMPLE 11

Silicon Monoxide

A major problem adversely affecting the widespread commercial suitability of sodium silicate as fire retardant, is the water solubility, and the surface deterioration resulting from exposure to air and moisture, as was described above. This adverse property excludes many possible applications for sodium silicate treated materials, including the possible external application for materials such as shingles, or decking material.

A possible solution for this problem would be to apply the technology for vapor deposition of silicon monoxide to sodium silicate treated samples. Silicon monoxide is used currently for computer microchip coating and is used to a limited extent as a treatment for plastic wrap to provide a moisture proof packaging material.

The results obtained from studies of sodium silicate treatment and sodium silicate/silicon monoxide treatment of various cellulosic samples are presented below. Ten sample types, treated with sodium silicate by five different methods, were tested. Two additional treatment methods, application of a micron thin layer of silicon monoxide by vapor deposition, and temperature curing were then tested with sodium silicate samples, were then evaluated, with the objective of eliminating the high water solubility observed in sodium silicate treated samples.

In the present study, vapor deposition of silicon monoxide was accomplished using bench scale laboratory equipment requiring much more stringent conditions than that required in a commercial application. However under laboratory conditions it was possible to demonstrate the possibility of coating wood with silicon monoxide, a feat not previously attempted. The process of vapor deposition involved placing silicon monoxide granules in a tungsten basket filament, and creating a strong vacuum of $1.2 \times 10^{-5}$. The filament was then heated to a bright white heat, and the silicon monoxide was vaporized and dispersed throughout the chamber. Once the vacuum levels were reached and the filament reached the appropriate temperature, vapor deposition was accomplished in approximately one minute. By this method a layer of silicon monoxide the thickness of a few molecules was applied to the surface of sodium silicate treated wood samples.

When the samples were removed from the vaporization chamber, they were examined under a stereoscope, and no visual differences between sodium silicate treated wood samples, and silicon monoxide coated sodium silicate treated wood samples could be determined.

After the visual examinations, a water test was performed to test the hypothesis. A drop of 90° C. distilled water was placed on the surface of a sodium silicate and silicon monoxide treated sample, and on the surface of a sodium silicate treated control sample. The water droplet on the control sample was instantly absorbed by the wood, and began to soak through the material. When the water droplet was placed on the sodium silicate and silicon monoxide treated sample, the droplet balled up on the surface of the wood and remained there. No amount of the water droplet entered the wood. When the water droplet was examined microscopically, tiny air bubbles were observed on the surface of the sample, beneath the water droplet. These droplets resembled the air droplets found at the surface of a beaker when water is heating to the boiling point. The silicon oxide apparently prevented the water from penetrating to the interior portions of the wood sample.

This simple experiment indicated that the properties of silicon monoxide (glass) had been extended to the sodium silicate treated wood samples, including providing a moisture barrier and the associated protection from exposure to air. By this method, the disadvantages of sodium silicate alone may be overcome.

Figure 26:
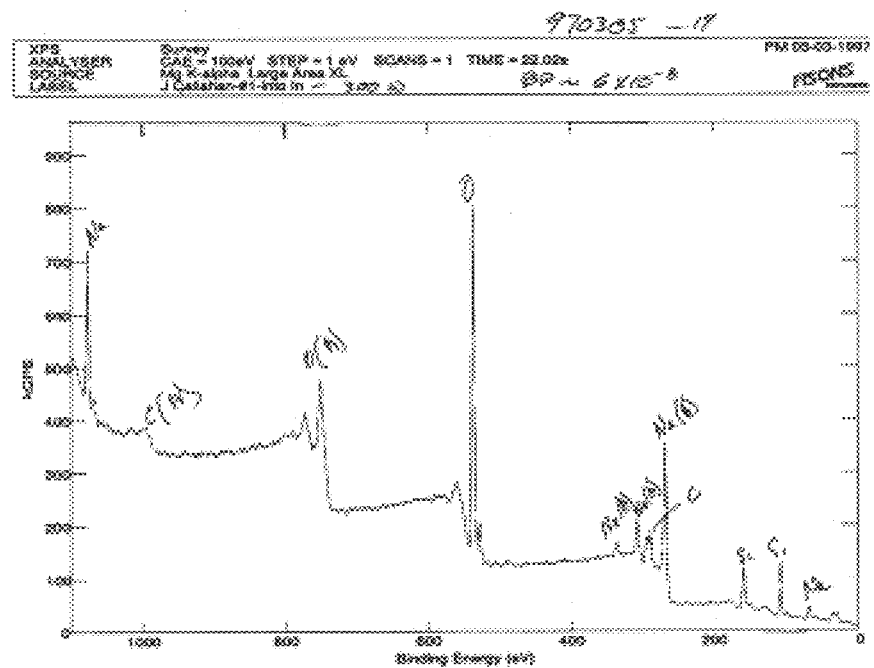
FIG. 26 shows the weight loss profile of sodium silicate/silicon monoxide treated samples.

FIG. 26 presents the results of burn tests of samples treated by vapor deposition with silicon monoxide following sodium silicate treatment. Comparisons of percent of sample remaining unburned during the 6–10 min burn trials are presented for wood samples treated with 400 g/kg sodium silicate solution, followed by application of vapor deposition coating of silicon monoxide [32], wood samples treated with 300 g/kg sodium silicate solution, followed by application of vapor deposition coating of silicon monoxide [33], and untreated wood control samples to which a vapor deposition coating of silicon monoxide [34], was applied.

Figure 27:
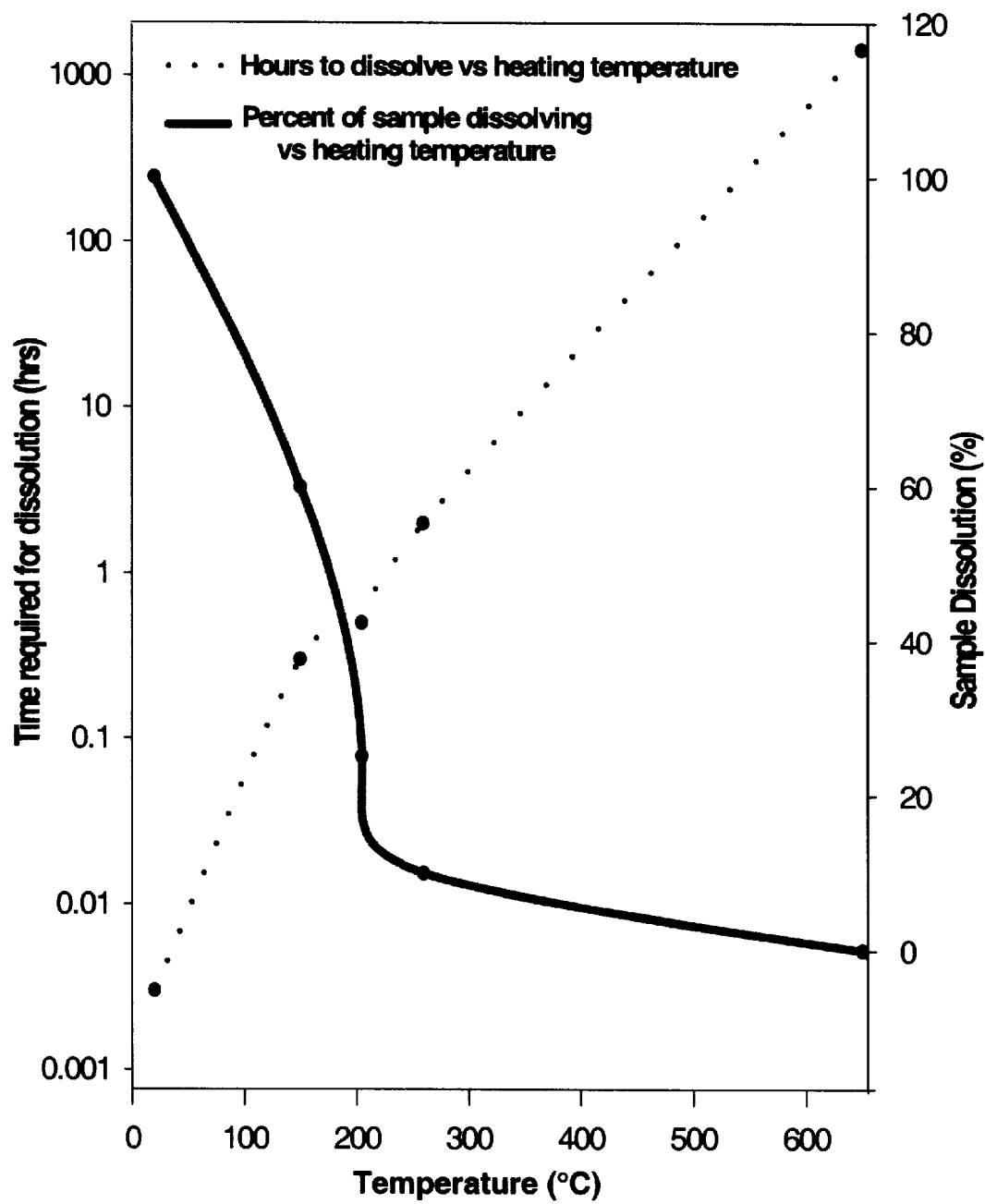
FIG. 27 shows the weight loss profile of sodium silicate treated controls.

FIG. 27 presents the weight loss profiles of sodium silicate treated controls. Comparisons of percent of sample remaining unburned during the 5 min burn trials are presented for wood samples treated with 400 g/kg sodium silicate solution [35], wood samples treated with 300g/kg sodium silicate solution [36], and untreated wood control samples [37], was applied.

Although the intended purpose was simply to demonstrate that the silicon monoxide treated samples were at least equivalent in fire retardant properties to the samples treated with sodium silicate alone, FIG. 26, when compared to the control (FIG. 27) showed a surprising increase in fire retardant properties. The data indicate that the total final weight loss was low (85%) and that this weight loss did not begin until well after the control had been completely consumed in the flame. This technique therefore not only is capable of eliminating the problems of leaching and surface deterioration associated with sodium silicate, but also is capable of providing enhanced fire retardant properties.

In a preferred form of the invention I have coated samples with a one micron thick silicon oxide containing coating.

The vapor deposition of silicon monoxide resulted in a molecular layer of silicon monoxide imparted on the surface of the sample, although the sample remained visually unchanged, due to the thinness of the layer of silicon monoxide.

To further test the integrity of the silicon monoxide moisture barrier, another test was performed. The test included placing water droplets on the surface of treated and untreated wood samples for 10 seconds, and then transferring the droplets to microscope slides for evaporation and examination of the resulting dried material. The results of this test showed that sodium silicate related crystals similar to those observed in pulverized wood/sodium silicate samples were found in the dried droplets of wood samples treated only with sodium silicate. The water droplet from the sodium silicate treated and silicon monoxide treated sample showed no evidence of sodium silicate crystallization. The results from the tests support the use of silicon monoxide monolayers as an effective moisture barrier for sodium silicate treated wood samples.

This finding is also applicable to other substances in addition to sodium silicate, for example the many other inorganic fire retardant chemicals, all of which are water soluble. It is the water solubility of some of the most effective fire retardants that have prevented their utilization on a wide scale.

This presents a possible solution to the ages-old problem of providing a fire retardant that is also moisture resistant.

The data show that water glass treatment may be effective in preventing flame propagation throughout wood samples. Even though the wood will burn in areas in direct contact with hot flame, the flames will not spread. This will help to keep small fires from spreading into large ones.

In all samples tested, including standard building materials: 1×4s, 2×4s, and pressure treated 1×4s, treatment with water glass was found to cause a reduction in flame propagation and in total amount of wood combustion.

For all samples flame resistance tended to increase as the concentration of water glass increased.

The greatest difference between the treated samples and the control was found with samples that were highly flammable for example paper and cloth.

In addition, since most fires start with flammable materials inside a building such as with paper and drapery, the findings that flammability can be reduced by up to 90% with the use of water glass, suggests that this substance may have potential for fire prevention in paper and cloth products.

In general, the more easily combustible the substance studied, the greater was the fire retardant effect of sodium silicate.

It was found that it was surprisingly difficult to get solid wood to burn, this was only accomplished when full force flames from the large nozzles of two blow torches were simultaneously directed onto 1×4 untreated pine samples. All of the samples burned more readily including pressure treated pine samples which burned thoroughly and easily. The most easily burned wood-based sample was wafer board which proved to be highly combustible.

Of all wood-based samples wafer board flame resistance was the most improved after treatment with water glass.

Sodium silicate, water glass, does appear to be an effective fire retardant chemical.

As can be concluded, wood products commonly used in construction including dimension lumber, plywood, particle board, and wafer board, and samples of paper and fabric were treated with sodium silicate ($Na_2O.SiO_2$, commonly known as water glass) in concentrations ranging from 400 g/kg to 0.04 g/kg and with $Na_2O.SiO_2$/vapor deposited silicon monoxide oxide ($SiO_2$) laminates to test the hypothesis that treatment with sodium silicate solutions would cause otherwise flammable materials to exhibit fire retardant properties, and to determine the effectiveness of these materials in terms of fire resistance, durability, duration of effectiveness, and moisture resistance. For sodium silicate as a sole treatment, flame retardance was found to increase as concentration of sodium silicate in solution increased. At the 200 g/kg concentration and above, no flame spread was observed and the improvement in fire resistance (as measured by reduction in total weight loss) ranged from 40% for 1×4 dimension lumber and furniture to 99% for plywood, particle board and shingles.

Fire retardance was found to increase as sodium silicate increased. In samples treated by soaking in a 0.04 g/kg sodium silicate solution, no difference was observed between treated and untreated samples. At sodium silicate application concentrations ranging from 0.4 g/kg to 4 g/kg, flame retardance was found to increase as concentration of sodium silicate in solution increased, at concentrations of 40 g/kg and above fire resistance was greatest and was essentially unchanged. At the 10–400 g/kg concentrations, no flame spread was observed and the improvement in fire resistance (as measured by reduction in total weight loss) ranged from 75% for 1×4 dimension lumber and furniture to 99% for plywood, particle board and shingles. In flame tests with sodium silicate treated samples, sodium silicate was found to form a hard foam-like material that created a physical barrier as well as chemical barrier against flame spread.

Sodium silicate was found to be highly water soluble before flame tests and water insoluble after flame tests. A possible explanation for this difference is that as a result of the application of heat, the sodium silicate undergoes dehydration (loss of water) and a process of polymerization that forms increasingly larger moieties of $(SiO_4)_n^{-1}$ while still maintaining an overall charge of −1 that forms an association with the free sodium. As the material polymerizes the resultant material increases in size to the point that it is no longer able to dissolve in water, thus becoming insoluble and increasingly glass-like. At lower temperatures, the process apparently occurred to various degrees based on the temperatures and the duration of exposure.

It was found that in samples soaked in sodium silicate and then dried, that a layer of sodium silicate formed on all surfaces and sodium silicate was found throughout the interior of the sample when examined microscopically. When sodium silicate and wood fragments were mixed, the result was crystal formations not observed with either sodium silicate alone or aqueous wood slurries alone. Sodium silicate impregnated samples were found to be more resistant to compression and to weigh less than untreated samples. Sodium silicate treated samples were found to be capable of performing woodworking applications such as hammering, cutting, and nailing. In terms of duration of effectiveness, in tests conducted over a one year period, it was found that in samples that had been soaked in sodium silicate solutions for several hours to several days, the coating were still intact although they were white and somewhat chalky. In samples that were quickly dipped in sodium silicate with the result that a relatively thick layer of sodium silicate was formed on the surface, the coatings remained completely intact but became deeply cracked and a thin layer of white granular material was observed on the outer surfaces in the areas directly in contact with air. In samples in which a thin layer of sodium silicate was applied with a painting technique, such as used for painting walls and in furniture finishing, over a period of a few months all of the sodium silicate layer had cracked and sloughed off. Samples of sodium silicate applied to glass slides and examined microscopically showed evidence of the beginning of cracking with a one hour time period; there were larger and deeper cracks in thicker samples with higher concentrations, and smaller and more numerous cracks in thinner samples with lower concentrations. In summary cracking and peeling, and surface granulation upon exposure to air and moisture are problems associated with the use of sodium silicate.

In terms of moisture resistance, sodium silicate soaked samples were exposed to effects of weathering for a one year period. It was found that there was evidence of leaching of sodium silicate from the wood, with approximately fifty percent of the sodium silicate removed after one year. Sodium silicate wafers dissolved in boiling water within 30–60 seconds. Thus surface layers of sodium silicate were shown to be very vulnerable to moisture. In samples in which sodium silicate was initially applied in small drops, after one year of weathering, the sodium silicate curled up and away from the wood in small white flakes. In samples soaked in sodium silicate, no visible flaking was observed after a one-year period. Samples soaked at concentrations of 300 g/kg and below no there was visible evidence of the presence of sodium silicate on the surface at any time.

Samples treated with sodium silicate by soaking in 200–300 g/kg concentrations followed by drying were found to be highly flame retardant in interior applications where contact with water would be prevented. Samples soaked 1–7 days in 300 g/kg sodium silicate solutions and below were found to experience no observable deterioration and no loss in fire retardant capability after a one year time period, although adverse effects of water solubility, chipping and peeling, and surface granulation were observed for other concentrations and application methods. No adverse effects on conventional uses of wood such as for hammering, nailing, and drilling were observed for sodium silicate treated samples.

Two additional approaches were utilized to study the problems of moisture resistance and chipping and flaking. One-year-old samples containing sodium silicate foam formed during burn tests were placed in a container of boiling water. It was observed that the foam samples floated in the water and did not dissolve during a 5 minute boiling test and subsequent soaking for over 24 hours. These samples showed no changes in the foam over a one-year period.

Sodium silicate treated samples were dried and then a molecular layer of silicon monoxide was applied to all surfaces by vapor deposition. The samples were tested for moisture resistance by applying a stream of boiling water to the surface of the samples, and the water was examined microscopically for evidence of sodium silicate crystals as the water evaporated. No evidence of sodium silicate presence was detected, indicating the desired moisture resistance was achieved.

The application of a micro layer of silicon monoxide glassy films to the surface of a sodium silicate treated sample provided a product that was strong, fire retardant, and moisture resistant, and therefore effective for internal and external uses. Sodium silicate, was found to be an effective fire retardant material, and when combined with the silicon monoxide was found to solve the problems of lack of moisture resistance and leaching.

We claim:

1. A process of imparting fire retardant properties to a combustible material comprising impregnating the combustible material with sodium silicate by contacting a sodium silicate solution with the material to be impregnated, dehydrating the solution; and depositing a coating of silicon oxide ranging from a monomolecular layer to a micron thin layer on the sodium silicate impregnated material.

2. The process of claim 1 wherein the contacting step is selected from the group consisting of dipping and soaking.

3. The process of claim 1 wherein the contacting step is performed at subatmospheric pressure.

4. The process of claim 1 wherein the contacting step is performed at superatmospheric pressure.

5. The process of claim 1 where sufficient depositing is effected so as to impart waterproofing properties to the sodium silicate impregnated material.

6. The process of claim 1 wherein sufficient depositing is effected so as to impart fire resistance to the sodium silicate impregnated material.

7. The product produced by the process of claim 1.

8. The product produced by the process of claim 5.

9. The product produced by the process of claim 6.

10. The process of claim 1 wherein the sodium silicate solution has a concentration of 0.04g–400g of sodium silicate per kilogram of water.

11. The process of claim 10 wherein the concentration is 200–300 grams sodium silicate per kilogram of water.

12. The process of claim 1 wherein the coating is a mono-molecular layer of silicon monoxide.

13. The process of claim 1 wherein the coating is achieved by vacuum depositing a vaporized silicon oxide onto the sodium silicate impregnated material.

14. The process of claim 1 wherein the combustible material is a cellulosic material.

15. The process of claim 1 wherein the combustible material is a woven or non-woven fabric, paper, or furniture.

16. The process of claim 1 wherein the coating of silicon oxide is deposited as a monomolecular layer on the sodium silicate impregnated material.

17. The process of claim 1 wherein the coating is a micron to monomolecular layer of silicon dioxide.

18. The process of claim 1 wherein the coating of silicon oxide coating is a micron layer of silicon dioxide.

19. The process of claim 1, including the additional step of polymerizing the sodium silicate after dehydration.

20. A method of imparting fire retardancy to a porous material selected from the group consisting of paper and fabric, said method comprising contacting the porous material with a solution of sodium silicate in an amount and under conditions sufficient to impregnate the porous material, and dehydrating the sodium silicate solution and thereafter depositing onto the porous material a silicon oxide layer ranging from a monomolecular layer to a micron thin layer.

21. The process of claim 20 wherein the fabric is a non-woven comprised of a plurality of fibers wherein said fibers are at least partially adhered with each other by the sodium silicate.

* * * * *